(12) United States Patent
Yaras

(10) Patent No.: US 10,591,812 B2
(45) Date of Patent: Mar. 17, 2020

(54) PROJECTOR WITH SCANNING ARRAY LIGHT ENGINE

(71) Applicant: Magic Leap, Inc., Plantation, FL (US)

(72) Inventor: Fahri Yaras, Cedar Park, TX (US)

(73) Assignee: MAGIC LEAP, INC., Plantation, FL (US)

( * ) Notice: Subject to any disclaimer, the term of this patent is extended or adjusted under 35 U.S.C. 154(b) by 0 days.

(21) Appl. No.: 16/203,229

(22) Filed: Nov. 28, 2018

(65) Prior Publication Data

US 2019/0204725 A1 Jul. 4, 2019

Related U.S. Application Data

(63) Continuation of application No. 15/828,005, filed on Nov. 30, 2017, now Pat. No. 10,175,564.
(Continued)

(51) Int. Cl.
*H04N 9/31* (2006.01)
*G03B 21/20* (2006.01)
(Continued)

(52) U.S. Cl.
CPC ..... *G03B 21/2046* (2013.01); *G03B 21/2013* (2013.01); *G03B 21/2033* (2013.01);
(Continued)

(58) Field of Classification Search
CPC ............ G03B 21/2033; G03B 21/2013; G03B 21/2093; G03B 21/2046; H04N 9/3164; H04N 9/3152; H04N 9/3138
See application file for complete search history.

(56) References Cited

U.S. PATENT DOCUMENTS 7,206,107 B2 4/2007 Levola
7,978,407 B1 7/2011 Connor
(Continued)

FOREIGN PATENT DOCUMENTS

GB 2476160 A 6/2011
WO 2013093510 A2 6/2013

OTHER PUBLICATIONS

PCT/US2017/064009, "International Search Report and Written Opinion", dated Feb. 13, 2018, 10 pages.
(Continued)

*Primary Examiner* — Ryan D Howard
(74) *Attorney, Agent, or Firm* — Kilpatrick Townsend & Stockton LLP

(57) ABSTRACT

A projector assembly includes a light emitting diode (LED) array, wherein the LED array has an array axis, wherein the LED array includes a plurality of LEDs arranged along the array axis, and wherein the plurality of LEDs are individually addressable. The projector assembly includes a rotatable actuator supporting the LED array, wherein the rotatable actuator has a rotation axis, and wherein the rotation axis and the array axis are parallel. The projector assembly includes a collimator positioned in optical communication with the LED array for collimating light emitted from the plurality of LEDs and a set of imaging optics positioned in optical communication with the collimator for focusing collimated light and forming a first image of the LED array at a distance, wherein the first image includes a first axis corresponding to the array axis and a second axis orthogonal to the rotation axis.

20 Claims, 16 Drawing Sheets

Related U.S. Application Data

(60) Provisional application No. 62/429,003, filed on Dec. 1, 2016.

(51) Int. Cl.
*F21Y 105/10* (2016.01)
*F21Y 115/10* (2016.01)

(52) U.S. Cl.
CPC ......... *H04N 9/3129* (2013.01); *H04N 9/3138* (2013.01); *F21Y 2105/10* (2016.08); *F21Y 2115/10* (2016.08)

(56) References Cited

U.S. PATENT DOCUMENTS

| | | |
|---|---|---|
| 10,175,564 B2 | 1/2019 | Yaras |
| 2004/0239892 A1* | 12/2004 | Cok .................. H04N 9/3129 353/94 |
| 2005/0052376 A1 | 3/2005 | Shivji |
| 2011/0001804 A1 | 1/2011 | Urey et al. |
| 2011/0286063 A1 | 11/2011 | McGrew |
| 2013/0285885 A1 | 10/2013 | Nowatzyk et al. |
| 2016/0231567 A1 | 8/2016 | Saarikko et al. |
| 2016/0231568 A1 | 8/2016 | Saarikko et al. |
| 2017/0223344 A1 | 8/2017 | Kaehler |

OTHER PUBLICATIONS

EP17876905.5, "Extended European Search Report", dated Nov. 29, 2019, 10 pages.

\* cited by examiner

PROJECTOR WITH SCANNING ARRAY LIGHT ENGINE

CROSS-REFERENCE TO RELATED APPLICATIONS

This application is a continuation of U.S. patent application Ser. No. 15/828,005, titled "Projector With Scanning Array Light Engine," filed on Nov. 30, 2017, now U.S. Pat. No. 10,175,564 issued on Jan. 8, 2019 which claims the benefit of and priority to U.S. Provisional Patent Application No. 62/429,003, filed on Dec. 1, 2016, the disclosures of which are hereby incorporated by reference in their entireties for all purposes.

BACKGROUND

Image projectors can take many forms and use a variety of different technologies, which range in both cost and complexity. For example, many common projectors used in office, conference, and home theater systems for video projection make use of 3 color light recombination (red, green, blue) for full color video. In liquid crystal display (LCD) projectors, light from a lamp is separated for each of the red, green, and blue components and passed through LCD gates including a plurality of pixels for blocking or allowing the light to pass to generate an output light pattern. Digital light processing (DLP) and liquid crystal on silicon (LCOS) projectors use similar technology but respectively make use of micromirror and reflective active matrix liquid-crystal elements for generating the output light patterns instead of LCD gates. Due to the need for including optical elements for each of the 3 colors, these systems may be large and overly complex.

SUMMARY

The present disclosure relates to image projection. In particular, the present disclosure relates to a light emitting diode based image projector. Described herein are LED-based image projection systems and related projection methods. The systems and methods described herein make use of an array of LEDs, which output light that is projected using optical elements to form images at a distance. The size and/or number of LEDs in the LED array may be reduced as compared to other LED projection technologies by placing the LED array on a movable actuator, such as a rotatable actuator, so that images of the LED array at different positions can be generated and combined to form a composite frame. For example, as the LED array is rotated as a function of time, a sequence of images of the array can be generated. When done at a rapid enough rate, a section by section composite frame, similar to a progressive scan frame, can be produced, and this process can be repeated to project a video image.

In a first aspect, projector assemblies are provided. In a specific embodiment, a projector assembly comprises a light emitting diode (LED) array such as an LED array that has an array axis and includes a plurality of LEDs arranged along the array axis. The plurality of LEDs can be individually addressable. The projector assembly further comprises a movable actuator supporting the LED array such as a rotatable actuator that has a rotation axis that is parallel to the array axis or a translatable actuator that has a translation axis perpendicular to the array axis and a set of imaging optics positioned in optical communication with the LED array for forming a first image of the LED array at a distance. For example, the first image may include a first axis corresponding to the array axis and a second axis orthogonal to the rotation axis or parallel to the translation axis. Optionally, output intensities of each of the plurality of LEDs are independently controllable.

A variety of LED arrays are useful with the projector assembles described herein. For example, in some embodiments, the LED array comprises a one-dimensional LED array. Optionally, the LED array comprises a two-dimensional LED array. Useful LED arrays include LED arrays having any practical number of elements. For example, in some embodiments, the LED array includes about 800 pixels, about 1024 pixels, about 1280 pixels, about 1440 pixels, about 1600 pixels, about 1920 pixels, about 2560 pixels, about 3840 pixels, about 7680 pixels, or more than about 7680 pixels. Optionally, each pixel corresponds to one or more corresponding LEDs of the LED array.

In embodiments, the plurality of LEDs may generate light of any suitable color or wavelength. For example, in some embodiments, the plurality LEDs include a first plurality of LEDs for producing light including a first wavelength, a corresponding second plurality of LEDs for producing light including a second wavelength different from the first wavelength, and a corresponding third plurality of LEDs for producing light including a third wavelength different from the first wavelength and the second wavelength. In this way, full color images may be generated by combining light from LEDs of three different colors. For example, in some embodiments, a set of three corresponding LEDs make up a pixel of the LED array. Optionally, a set of three corresponding LEDs includes one LED from the first plurality of LEDs, one LED from the second plurality of LEDs, and one LED from the third plurality of LEDs. Other configurations are possible, including where multiple LEDs from a plurality of LEDs are included in a set of LEDs making up a pixel.

Optionally, one of the first, second, or third wavelengths is about 650 nm. Optionally, one of the first, second, or third wavelengths is about 520 nm. Optionally, one of the first, second, or third wavelengths is about 450 nm. Optionally, the light of the first, second, or third wavelength is or peaks at about 650 nm. Optionally, the light of the first, second, or third is or peaks at about 520 nm. Optionally, the light of the first, second, or third is or peaks at about 450 nm. Other color/wavelength combinations are possible.

In some embodiments, the first plurality of LEDs, the second plurality of LEDs, and the third plurality of LEDs include a same number of LEDs. However, in other embodiments, each of the first, second and third plurality of LEDs may include different numbers of LEDs. For example, in some embodiments, the first plurality of LEDs includes a different number of LEDs as the second plurality of LEDs, the third plurality of LEDs or both the second plurality of LEDs and the third plurality of LEDs.

The LEDs in the array may be arranged according to any preferred configuration. For example, in some embodiments, the first plurality of LEDs, the second plurality of LEDs, and the third plurality of LEDs are uniformly distributed along the array axis. Optionally, the first plurality of LEDs are spatially grouped. Optionally, the second plurality of LEDs are spatially grouped. Optionally, the third plurality of LEDs are spatially grouped. Grouping of LEDs of a common wavelength/color may be useful for some embodiments, including embodiments where generation of spatially distinct single-color images is desired. In some embodiments, each LED in the second plurality of LEDs is positioned adjacent to at least one corresponding LED in the first plurality of LEDs and at least one corresponding LED in the third plurality of LEDs.

LEDs included in the array may take on any suitable dimension. For example, in embodiments, each of the plurality of LEDs has a lateral dimension selected between about 0.5 µm and about 5 µm. The LED array itself may also take on any suitable dimension. In some embodiments, the LED array has a width axis orthogonal to the array axis, and wherein the width axis corresponds to the second axis. For example, in some embodiments, the LED array has a length along the array axis selected between about 100 µm and about 10000 µm. Optionally, the LED array has a length along the width axis between about 0.5 µm and about 100 µm.

LEDs of any suitable switching speed may be used with the methods and assemblies described herein. It will be appreciated that a switching speed as fast as or faster than a desired frame rate for a video image may be useful with some embodiments. Optionally, each of the plurality of LEDs are switchable at a frequency greater than or about 30 Hz, greater than or about 60 Hz, greater than or about 120 Hz, greater than or about 240 Hz, greater than or about 1 kHz, greater than or about 1 MHz, or between about 10 Hz and about 10 MHz.

In embodiments, supporting the LED array by a rotatable actuator is useful to allow the LED array to generate outputs that may be spatially separated. In embodiments, the rotatable actuator comprises a microelectromechanical element. Optionally, the rotatable actuator comprises a piezoelectric element. The rotatable actuator may be rotatable to any suitable number of positions or to any suitable angle. In some embodiments, the rotatable actuator is controllable to a plurality of distinct positions parallel to the array axis including about 600, about 768, about 720, about 800, about 900, about 1024, about 1200, about 1080, about 1440, about 1600, about 2160, about 4230, more than about 4230 distinct positions parallel to the array axis, or between about 100 and about 100000 positions parallel to the array axis.

Optionally, the rotatable actuator has a length along the array axis that is about equal to a lateral dimension of the LED array along the array axis. Optionally, the LED array has a width axis orthogonal to the array axis. In embodiments, the rotatable actuator has a rotation angle around the rotation axis corresponding to an angle between an optical axis of the collimator or the set of imaging optics and the width axis, such as a rotation angle that is continuously or discretely controllable between about 45° and about +135°. It will be appreciated that, in some embodiments, rotation of the rotatable actuator about the rotation axis causes a displacement of the LED array orthogonal to the rotation axis.

In embodiments, supporting the LED array by a translatable actuator is useful to allow the LED array to generate outputs that may be spatially separated. In embodiments, the translatable actuator comprises a microelectromechanical element. Optionally, the translatable actuator comprises a piezoelectric element. The translatable actuator may be translatable to any suitable number of positions. In some embodiments, the translatable actuator is controllable to a plurality of distinct positions parallel to the array axis including about 600, about 768, about 720, about 800, about 900, about 1024, about 1200, about 1080, about 1440, about 1600, about 2160, about 4230, or more than about 4230 distinct positions parallel to the array axis.

Optionally, the translatable actuator has a length along the array axis that is about equal to a lateral dimension of the LED array along the array axis. Optionally, the LED array has a width axis orthogonal to the array axis. In embodiments, the translatable actuator is translatable along the translation axis continuously or discretely.

In a specific embodiment, the LED array outputs a one-pixel wide output and rotation of the LED array about the rotation axis or translation of the LED array along the translation axis generates a two-dimensional optical output corresponding to a composite of multiple one-pixel wide outputs. For example, the two-dimensional optical output may be imaged by the set of imaging optics to generate the first image.

Optionally, the set of imaging optics includes a collimator, which may be useful for generating collimated light from the LED array. In embodiments, the collimator comprises a lens or a mirror. Optionally, the collimator is positioned to receive light generated by the plurality of LEDs and output parallel light rays. In some embodiments, the collimator comprises an optical element that is contoured to output parallel or substantially parallel light rays from the plurality of LEDs as the rotatable actuator is moved, such as about the rotation axis or along a translation axis. Optionally, the collimator comprises a plurality of collimation elements each positioned to receive light generated by a subset of the plurality of LEDs and output parallel or substantially parallel light rays.

In embodiments, the collimator may include optical coatings or filters. For example, in some embodiments, the collimator includes a reflective or anti-reflective coating. Optionally, the collimator includes a polarizer.

Other optical elements are useful with the set of imaging optics. For example, in some embodiments, the set of imaging optics includes one or more lenses, mirrors, or filters. Optionally, the set of imaging optics focuses light generated by the plurality of LEDs to a focal length of between about 1 mm and 1 m. Optionally, optical elements of the set of imaging optics includes one or more reflective or anti-reflective coatings or a polarizer.

In some embodiments, a projector assembly may include one or more additional LED array for generating one or more additional images. Such images may optionally be spatially offset and may correspond to the same or different output intensities. In some embodiments, a projector assembly may further comprise a second LED array, such as a second LED array that has a second array axis and that includes a second plurality LEDs, such as individually addressable LEDs, that are arranged along the second array axis; and a second movable actuator supporting the second LED array, such as a rotatable actuator that has a second translation axis that is parallel to the second array axis or a translatable actuator that has a second translation axis that is perpendicular to the array axis. In some embodiments, the second LED array is positioned in optical communication with the set of imaging optics. For example, the second LED array may be positioned in optical communication with a collimator, such as a collimator that collimates light emitted from the second plurality of LEDs. Optionally, the set of imaging optics forms a second image of the second LED array at a distance, such as a second image that includes a third axis corresponding to the second array axis and a fourth axis orthogonal to the second rotation axis or parallel to the second translation axis.

Various configurations of the first LED array and the second LED array are possible. For example, the second array axis and the first array axis may optionally be parallel. Optionally, the second array axis and the first array axis may be perpendicular. Depending on the particular configuration, the LED array and the second LED array may optionally have different lateral dimensions and/or include different numbers of LEDs.

In some embodiments, the first image generated by the first LED array corresponds to a first depth field and the second image generated by the second LED array corresponds to a second depth field. In this way, the projector assembly may generate multiple images of a same scene, but featuring different depth planes, and be useful for generating an image that may have depth information. If using two projector assemblies, each assembly may generate an image from a slightly different perspective, making the depth fields useful for generation of a three dimensional display.

In some embodiments, the first image and the second image at least partially spatially overlap. In this way, the two images may complement one another, and may, for example, be useful for improving a video refresh rate. Optionally, the first image and the second image are spatially offset.

In another embodiment, multiple images may be generated using a single LED array, such as multiple spatially offset images. For example, in some embodiments, a projector assembly may further comprise a translation stage, for generating a relative translation between the LED array and the set of imaging optics. In this way, the LED array may be translated to a second position so that a second image may be generated. Optionally, the translation stage comprises a microelectromechanical element. Optionally, the translation stage comprises a piezoelectric element. In embodiments, the relative translation is along an axis perpendicular to the rotation axis or parallel to the translation axis. It will be appreciated that the relative translation may be useful for forming a second image of the LED array in a translated position.

Different configurations may be useful for generating the relative translation. For example, in some embodiments, translation stage is in mechanical communication with the rotatable actuator for translating the movable actuator and the LED array relative to the set of imaging optics. Optionally, the translation stage is in mechanical communication with the collimator for translating the set of imaging optics relative to the LED array.

Other components may be useful with the projector assemblies and methods described herein. For example, one or more waveguides or diffractive elements may be used, such as to aid in a viewer seeing the images generated by the projector assembly. For example, in some embodiments, a projector assembly may further comprise a first diffractive optical element positioned in optical communication with the set of imaging optics for receiving the first image of the LED array and generating first diffracted light; a waveguide positioned in optical communication with the first diffractive optical element for receiving the first diffracted light and transmitting the first diffracted light by total internal reflection; a second diffractive optical element positioned within or on the waveguide for generating second diffracted light from the first diffracted light; and a third diffractive optical element positioned in optical communication with the second diffractive element for third generating diffracted light from the second diffracted light. Additional details regarding the use of waveguides and diffractive elements for generating a display of the images generated by a projector assembly may be found in U.S. Provisional Application 62/377,831, filed Aug. 22, 2016, which is hereby incorporated by reference in its entirety.

In another embodiment, a projector assembly may comprise a light emitting diode (LED) array, such as an LED array has an array axis and includes a plurality of LEDs, which may be individually addressable, arranged along the array axis; a movable actuator supporting the LED array, such as a rotatable actuator that has a rotation axis that is parallel to the array axis or a translatable actuator that has a translation axis that is perpendicular to the array axis; a set of imaging optics positioned in optical communication with the LED array for collecting light emitted by the plurality of LEDs and forming one or more images of the LED array at a distance, such as one or more images that include a first axis corresponding to the array axis and a second axis orthogonal to the rotation axis or parallel to the translation axis.

In some embodiments, the set of imaging optics may not include a collimator. When a collimator is not included, directional information for light generated by the LED array may be retained in the projected image, which may be useful for some embodiments. For example, it will be appreciated that retaining directional information may be useful for light field applications, where direction, phase, and/or amplitude/intensity may be retained in order to generate a three-dimensional or four-dimensional image. Optionally, the plurality of LEDs each have independently controllable output amplitudes. Optionally, the set of imaging optics includes one or more electro-optic elements for controlling and/or retaining a phase of light emitted by the plurality of LEDs. Optionally, the set of imaging optics includes one or more elements for controlling and/or retaining directional information for light emitted by the plurality of LEDs. Optionally, a rotatable actuator controls a direction of light generated by the LED array.

In another aspect, methods are described for generating images, such as by using a projector assembly described herein. In one example, a method embodiment of this aspect may comprise creating a first partial image using a projector assembly, moving a movable actuator of the projector assembly to move the LED array of the projector assembly to a second position; and creating a second partial image using the projector assembly. Optionally, the first partial image and the second partial image are spatially offset and together form a first composite image.

In some embodiments, the movable actuator comprises a rotatable actuator. In some embodiments, a method of this aspect may further comprise rotating the rotatable actuator one or more times and creating one or more corresponding additional partial images, such as where the one or more corresponding additional partial images are each spatially offset from other partial images and together form the first composite image. Optionally, rotating the rotatable actuator includes rotating the rotatable actuator by a discrete angle. Optionally, rotating the rotatable actuator includes rotating the rotatable actuator continuously.

In some embodiments, the movable actuator comprises a translatable actuator. In some embodiments, a method of this aspect may further comprise translating the translatable actuator one or more times and creating one or more corresponding additional partial images, such as where the one or more corresponding additional partial images are each spatially offset from other partial images and together form the first composite image. Optionally, translating the translatable actuator includes translating the translatable actuator by a discrete distance. Optionally, translating the translatable actuator includes translating the translatable actuator continuously.

In some embodiments, creating the first partial image, moving the movable actuator, and creating the second partial image are repeated at a rate of about 30 Hz, about 60 Hz, about 120 Hz, about 240 Hz, greater than about 240 Hz, or between about 10 Hz and 480 Hz. In this way, methods of this aspect may be used for generating video images.

Optionally, the projector assembly may include a translation stage for generating relative translations between the LED array and the set of imaging optics. In some embodiments, a method of this aspect may further comprise generating a relative translation between the LED array and the set of imaging optics such that the LED array is translated to a translated relative position; creating a third partial image, such as by generating a third light using the LED array at the translated relative position and imaging the third light by the set of imaging optics to form the third partial image; moving the movable actuator to move the LED array to a translated and moved relative position; creating a fourth partial image, such as by generating a fourth light using the LED array at the translated and moved relative position and imaging the fourth light by the set of imaging optics to form the fourth partial image, so that the third partial image and the fourth partial image are spatially offset and together form a second composite image. Optionally, the first composite image corresponds to a first depth field and the second composite image corresponds to a second depth field.

Optionally, the projector assembly may include two or more LED array, such as two or more LED array each having independent array axes, and independently include a pluralities of LEDs, where each LED element is individually addressable, arranged along the respective array axes; and two or more movable actuator each respectively supporting an LED array. Each LED array may be positioned in optical communication with a set of imaging optics so that images of each LED array may be formed at a distance.

Optionally, a method of this aspect may comprise creating a third partial image, such as by generating third light using a second LED array at a third position, and imaging the third light by the set of imaging optics to form the third partial image; moving a second movable actuator to move the second LED array to a fourth position; creating a fourth partial image, such as by generating fourth light using the second LED array at the fourth position and imaging the fourth light by the set of imaging optics to form the fourth partial image. Optionally, the third partial image and the fourth partial image are spatially offset and together form a second composite image. Again, it will be appreciated that different composite images may correspond to different depth fields.

Optionally, projector assemblies useful with the methods described herein may further comprise a first diffractive optical element positioned in optical communication with the set of imaging optics for receiving the first image of the LED array and generating diffracted light; a waveguide positioned in optical communication with the first diffractive optical element for receiving the diffracted light and transmitting the diffracted light by total internal reflection; a second diffractive optical element positioned within or on the waveguide for generating diffracted light; and a third diffractive optical element positioned in optical communication with the second diffractive element for generating diffracted light. Optionally, a method of this aspect may further comprise diffracting at least a portion of the first composite image using the first diffractive optical element to generate a diffracted image, such as a diffracted image that is received by the waveguide; transmitting the diffracted image using the waveguide; diffracting at least a portion of the diffracted image using the second diffractive optical element to generate an expanded image; and diffracting at least a portion of the expanded image using the third diffractive optical element to generate an output image. In this way, images generated by the projector assembly may be displayed for a viewer.

In another aspect, projector assemblies are provided. In an embodiment, a projector assembly comprises a LED array, wherein the LED array has an array axis, wherein the LED array includes a plurality of LEDs arranged along the array axis, and wherein the plurality of LEDs are individually addressable. The projector assembly further comprises a rotatable actuator supporting the LED array, wherein the rotatable actuator has a rotation axis, and wherein the rotation axis and the array axis are parallel, and a set of imaging optics positioned in optical communication with the LED array for collecting light emitted by the plurality of LEDs and forming one or more images of the LED array at a distance, wherein the one or more images include a first axis corresponding to the array axis and a second axis orthogonal to the rotation axis. Optionally, the output amplitude of the plurality of LEDs can be independently controllable.

Optionally, the set of imaging optics may further comprise one or more electro-optic elements for controlling a phase of light emitted by the plurality of LEDs. The set of imaging optics may further comprise one or more elements for retaining directional information for light emitted by the plurality of LEDs. Optionally, the rotatable actuator can control a direction of light generated by the LED array.

Additional features, benefits, and embodiments are described below in the detailed description, figures, and claims.

DETAILED DESCRIPTION

The projector systems and methods described herein use an LED array including a plurality of LEDs arranged along an axis. The LED array may be supported by a movable actuator in order to move the LED array and generate images of the LED array in different positions. In some embodiments, the movable actuator is a rotatable microelectromechanical actuator. As the actuator is rotated, the LED array is moved to different physical positions. When light generated by the LED array is imaged using a set of imaging optics, spatially distinct images of the light from the LED array may be formed corresponding to the different physical positions of the LED array when moved by the actuator.

By controlling the rotation of the actuator and the timing and output of the LEDs in the LED array, video images may be generated. For example, a first image partial generated by the LED array at a first position may be generated. When the LED array is rotated to a second position and a second partial image may be generated by the LED array, where the second partial image may be offset from the first partial image both in space and time. This process may be repeated as the LED array is rotated through a fixed number of positions to generate a full image frame and then the process repeated in order to generate a video image having multiple frames.

The rotation of the LED array may also be a continuous process, rather than a discrete set of positions. The timing of output of the LED elements in the array may be controlled in order to create the partial images which together will make up a full image frame. Again, the process may be repeated in order to generate a video image having multiple frames.

The light from the LED array may be projected at a distance using an optical imaging system. For example, an optical imaging system may include one or more lenses, mirrors, collimators, and the like. Use of a collimator may be valuable for some embodiments, as some LEDs may generate a divergent output and so may benefit from collimation in order to project a sharp image at a distance.

Figure 1A:
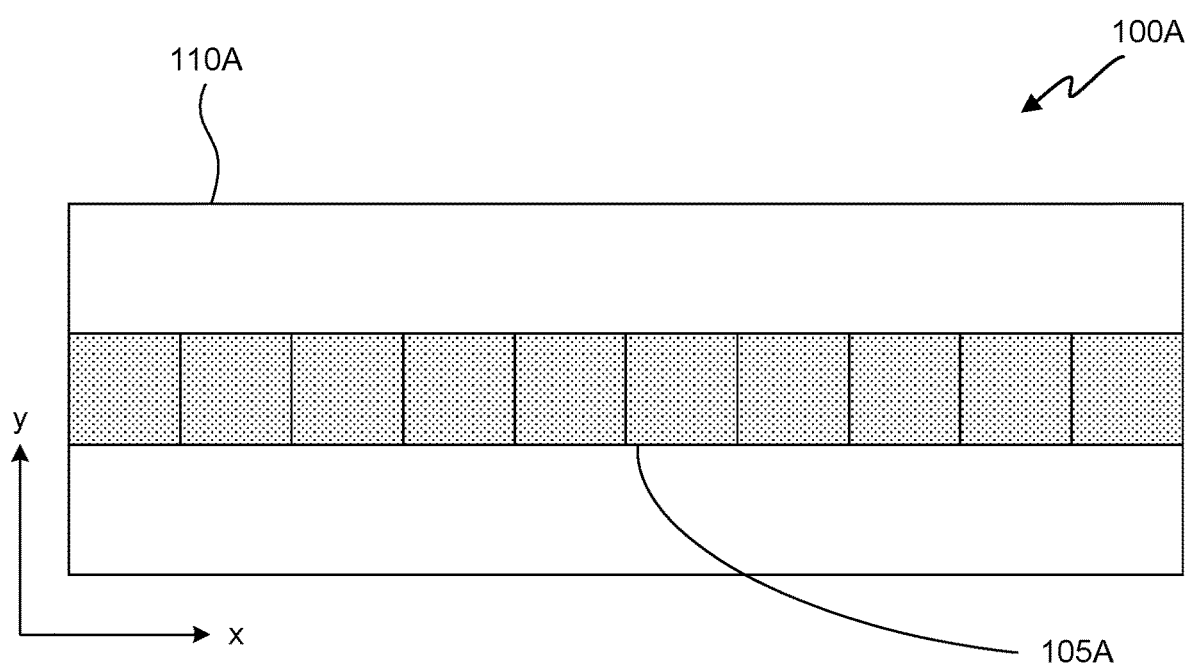
FIG. 1A, FIG. 1B, FIG. 1C, and FIG. 1D illustrate example LED arrays according to one embodiment.

FIGS. 1A-1D provide schematic illustrations of LED arrays 100A, 100B, 100C, and 100D. Each of the LED arrays 100A-100D include a plurality of individually addressable LED elements arranged along an axis, such as the x-axis as shown in FIG. 1A. In FIG. 1A, the LED array 100A includes LED elements 105A positioned on a supporting structure 110A, which may correspond to a movable actuator, such as a rotatable or translatable actuator. Each LED element 105A may correspond to a pixel element of a projected image. Although LED array 100A includes 10 LED elements 105, it will be appreciated that an LED array may include any number of LED elements, as desired, in order to generate an image with a desired resolution. For example, each pixel in a projected image may correspond to an LED element or a plurality of LED sub-elements.

In addition, an LED array may include a single line of LED elements (e.g., a 1-dimensional array) or multiple lines of LED elements (e.g., a 2-dimensional array), with any practical number of rows for generating images based on the movement of the LED array, such as by a rotatable actuator. For example, two or more rows of LED elements may be used, such as three rows, four rows, five rows, six rows, seven rows, eight rows, nine rows, or ten rows.

A variety of rotatable actuators may be used with the projection systems and methods described herein, including microelectromechanical rotation actuators, a magnetic-drive rotation actuator, an electric-drive rotation actuator, a cantilever-based rotation actuator, etc. It will be appreciated that, although the present description makes reference to rotatable actuators for moving an LED array for generation of a two-dimensional image, other movable actuators may be used to similarly generate a two-dimensional image. For example, in some embodiments, instead of a rotatable actuator, a translatable actuator may be used. In some embodiments a translatable actuator comprises a microelectromechanical actuator, a magnetic-drive actuator, an electric-drive actuator, a piezoelectric actuator, etc.

The LED elements in the LED array may take on any suitable shape, dimension, and arrangement. For example, the LED elements may have square, rectangular, or round output surfaces. The LED elements may have lateral dimensions ranging from about 0.5 μm to about 100 μm, depending on the desired configuration and output. In some specific embodiments the lateral dimensions between 0.5 μm and about 5 μm. The LED elements may be arranged in a side by side (strip) configuration, a checkered configuration, a PenTile Matrix configuration, etc.

Figure 1B:
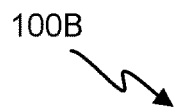
Figure 1B:
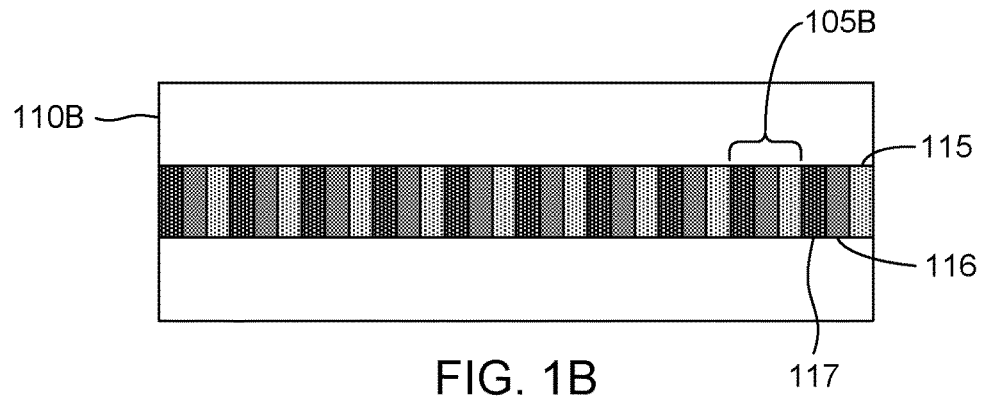

In FIG. 1B, the LED array 100B includes LED elements 105B positioned on a supporting structure 110B, which may correspond to a movable actuator, such as a rotatable or translatable actuator. Each LED element 105B may correspond to a pixel element of a projected image and may include sub-elements 115, 116, and 117, which may correspond to three different color LED elements (e.g., red, green, blue) arranged in a vertical strip configuration in order to generate a full color pixel element, where three adjacent LED elements correspond to sub-pixel elements and together make up a single pixel element. Although 30 LED sub-elements are depicted, it will be appreciated that any number of LED elements or sub-elements may be included, as desired.

Figure 1C:
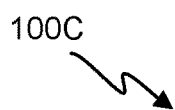
Figure 1C:
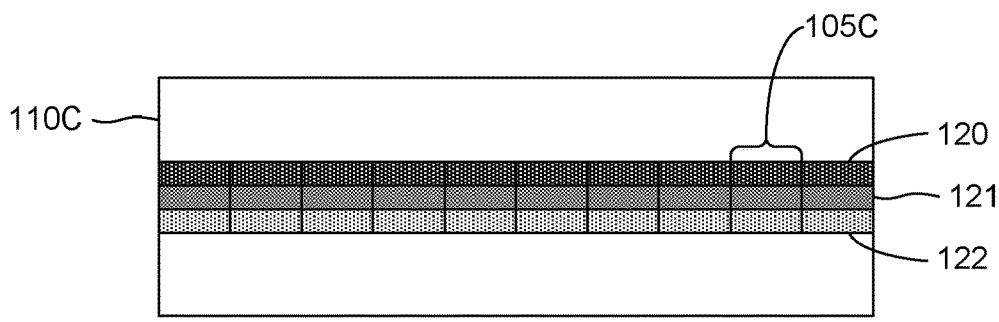

In FIG. 1C, the LED array 100C includes LED elements 105C positioned on a supporting structure 110C, which may correspond to a movable actuator, such as a rotatable or translatable actuator. Each LED element 105C may correspond to a pixel element of a projected image and may include sub-elements 120, 121, and 122, which may correspond to three different color LED elements (e.g., red, green, blue) arranged in a horizontal strip configuration in order to generate a full color pixel element. Again, it will be appreciated that any number of LED elements or sub-elements may be included, as desired.

Figure 1D:
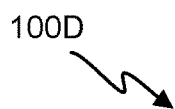
Figure 1D:
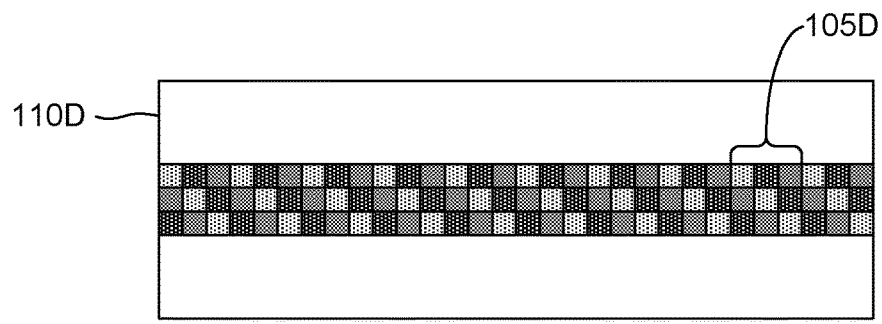

In FIG. 1D, the LED array 100D includes LED elements 105D positioned on a supporting structure 110D, which may correspond to a movable actuator, such as a rotatable or translatable actuator. Each LED element 105D may correspond to a pixel element of a projected image and may include sub-elements, which may correspond to three or more different color LED elements (e.g., red, green, blue, white) arranged in a checkered configuration in order to generate a full color pixel element. Again, it will be appreciated that any number of LED elements or sub-elements may be included, as desired. It will further be appreciated that the sub-pixel configurations illustrated in FIGS. 1B-1D are merely examples and that other sub-pixel configurations may be possible or desirable, and the use of sub-pixel rendering algorithms may also be possible or desirable.

In embodiments, an LED array may include any practical number of LED elements in order to project an image of a desired first resolution. For example, an LED array having 1024 elements, where each element may include multiple sub-elements, may correspond to an image having a first resolution including lines of 1024 pixels. Other examples are possible, including, but not limited to, LED arrays having 600 elements, 720 elements, 768 elements, 800 elements, 900 elements, 1080 elements, 1200 elements, 1280 elements, 1440 elements, 1600 elements, 1920 elements, 2160 elements, 2560 elements, 3850 elements, 4230 elements, or 7680 elements. It will be appreciated that these numbers of elements are merely examples and may correspond to common digital image resolutions.

Figure 2A:
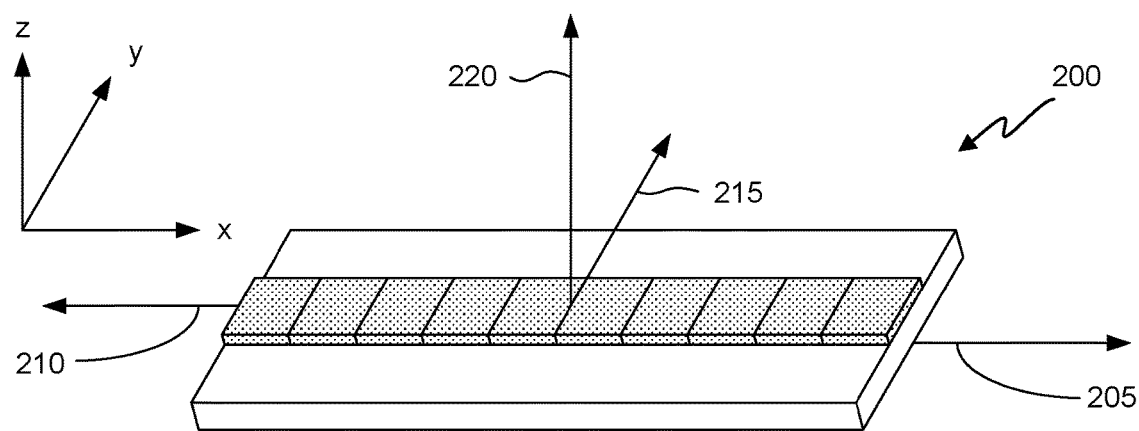
FIG. 2A, FIG. 2B, and FIG. 2C illustrate rotation of an LED array according to an embodiment.
Figure 2B:
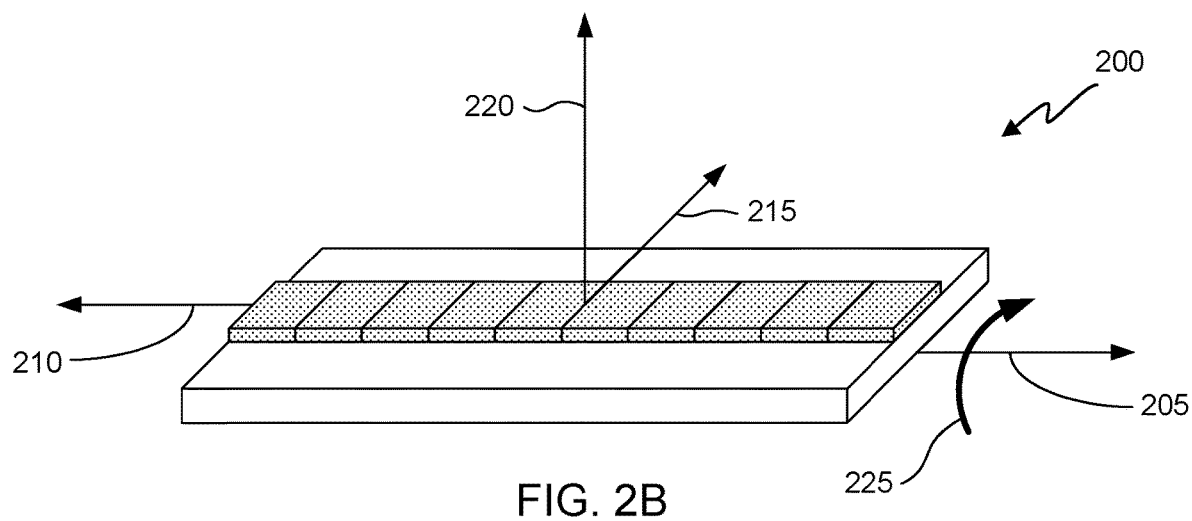
Figure 2C:
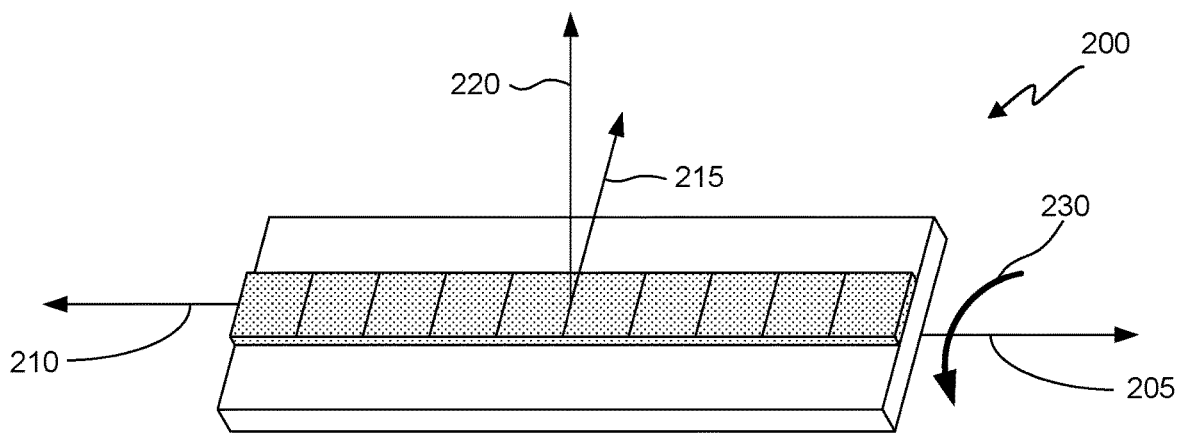

FIGS. 2A-2C depict an LED array 200 rotated among various positions around an axis of rotation 205. As illustrated, axis of rotation 205 may be parallel to the x-axis, as depicted in FIG. 2A. It will be appreciated that the axis of rotation may be positioned at any suitable location proximal to the LED array, such as below the LED array, and may be dictated by the specific geometry and configuration of the supporting structure and rotatable actuator used. The LED array 200 is depicted as having an array axis 210 parallel to the axis of rotation 205 and an axis 215 orthogonal to the array axis. Axis 220 may correspond, for example, to an optical axis of a set of optical elements used for projecting light generated by LED array 200, and may be parallel to the z-axis as illustrated in FIG. 2A. FIG. 2A is depicted as a configuration where axis 220 and axis 215 are perpendicular.

In some embodiments, two axes or object referred to as being parallel may correspond to the two axes or objects being absolutely parallel or substantially parallel, such as arranged to within about ±5 degrees of being absolutely parallel. In some embodiments, two axes or objects referred to as being perpendicular or orthogonal may correspond to the two axes or objects being arranged at exactly 90 degrees with respect to each other or substantially perpendicular or substantially orthogonal to one another, such as arranged to between about 85 and about 95 degrees with respect to each other. In some embodiments, when two objects or axes are arranged substantially parallel, substantially perpendicular, or substantially orthogonal, the utility may not be impacted and still may provide for a similar utility as though the objects were exactly parallel, exactly perpendicular, or exactly orthogonal.

For example, although the axis of rotation 205 and array axis 210 are depicted in FIGS. 2A-2C as being exactly parallel, the LED array 200 would also be useful for operating according to the principles described herein in order to generate composite images upon rotation of the LED array 200 about the axis of rotation 205 if the axis of rotation 205 and the array axis 210 were substantially parallel.

It will further be appreciated that the term "about" as used herein indicates that values proximate to a stated value may be included or used without departing from the spirit of the invention. Optionally, "about" may indicate that a value may include values within 10% of a stated value. As one example, "about 10" may correspond to between 9 and 11, inclusive.

FIG. 2B shows LED array 200 rotated in a first direction 225 about the axis of rotation 205, such that an angle between axis 215 and axis 220 is more than 90 degrees. FIG. 2C shows LED array 200 rotated in a second direction 230 about the axis of rotation 205 opposite to the first direction, such that an angle between axis 215 and axis 210 is less than 90 degrees, such as between 0 degrees and 90 degrees. It will be appreciated that, in some embodiments, a rotatable actuator providing the rotation of LED array 200 about the axis rotation may be configured to provide a continuous rotation, such that an angle between axis 215 and axis 220 may be continuously adjustable, such as to any value. In other embodiments, the rotatable actuator may be configured to provide stepped rotation, such that an angle between axis 215 and axis 220 may be discretely adjustable only to particular values.

In some embodiments, LED array may be rotated about the array axis between two maximum rotation amounts, such as a first maximum amount along a first rotation direction, such as rotation direction 225, and a second maximum amount along a second rotation direction, such as rotation direction 230. In some embodiments, the rotation may occur continuously or in discrete steps. Optionally, the LED array may be rotated along the first direction in discrete steps to the first maximum and then quickly rotated along the second direction to the second maximum in one step and again rotated discrete steps along the first direction to the first maximum. In this way, a one-directional progressive rotation may be established. Optionally, the LED array may be rotated along the first direction in discrete steps to the first maximum and then rotated along the second direction in discrete steps to the second maximum and then this process repeated. In this way, a two-directional progressive rotation may be established. Depending on the particular projection configuration, these or other rotation schemes may be used to generate composite images by rotating the LED array and controlling the timing and output of the individual LED elements to generate a desired image.

Using the three positions depicted in FIGS. 2A-2C, an image with three rows of pixels may be generated. Any number of positions may be used with the systems and methods disclosed herein. In some embodiments, the rotation of the LED array 200 about axis of rotation 205 between positions will have a magnitude sufficient for spatially separating the light projected from the LED array in each position. For example, the light from the LED array in the position corresponding to FIG. 2A may be a central pixel line, while the light from the LED array in the position corresponding to FIG. 2B may be offset above the central pixel line and the light from the LED array in the position corresponding to FIG. 2C may be offset below the central pixel line. In this way, distinct rows of pixels may be generated using the systems and methods described herein.

In some embodiments, however, the LED array may be rotated an amount such that the images generated may at least partially overlap. Such a configuration may be useful for some embodiments, such as where sub-pixel rendering may aid in the creation of image details. In addition, for some LED array configurations, such as the horizontal strip configuration shown in FIG. 1C, overlapping pixel lines may be useful for improving the resolution of the output image along a direction perpendicular to the axis of rotation. In some embodiments, the size of a pixel element may correspond to the total size of a set of sub-pixel elements, such as a lateral dimension of the LED elements of the LED array 200. In other embodiments, the size of a pixel element may correspond to the size of an individual sub-pixel element. For example, using the LED array 110C shown in FIG. 1C, the top line of LED sub-elements 120 first may be used to generate a line of red pixel outputs for a particular pixel line. Then, the LED array 110C may be rotated such that green light from the middle line of LED sub-elements 121 may be projected to generate a line of green pixel outputs having the same spatial position as the red pixel outputs previously generated. Finally, the LED array 110C may be rotated such that blue light from the bottom line of LED sub-elements 122 may be projected to generate a line of blue pixel outputs having the same spatial position as the red pixel outputs and green pixel outputs previously generated. In this way, the overall image resolution along the direction perpendicular to the axis of rotation may be improved by a factor of 3 as compared to the configuration where the pixel elements do not overlap.

In embodiments, the LED array may be rotatable to any practical number of positions in order to project an image of a desired second resolution. For example, a rotatable actuator may be rotatable to about 1280 positions, so that each position may provide a partial image in order for the full image to have a resolution including 1280 lines of pixels. Other examples are possible, including, but not limited to, where a rotatable actuator is rotatable to 600 positions, 720 positions, 768 positions, 800 positions, 900 positions, 1080 positions, 1200 positions, 1280 positions, 1440 positions, 1600 positions, 1920 positions, 2160 positions, 2560 positions, 3850 positions, 4230 positions, or 7680 positions. It will be appreciated that these numbers of positions are merely examples and may correspond to common digital image resolutions.

In other embodiments, the LED array may be continuously rotatable instead of discretely rotatable. In order to project an image with different lines of pixels, the elements of the LED array may have their outputs controlled. For example, when the LED array is in a first position, the output of the LED array may be controlled to project a first line of pixels corresponding to a first portion of a full frame. As the LED array is rotated, the output of the LED array may be timed so that when the LED array is in the appropriate position, a second output of the LED array may be controlled to project a second line of pixels corresponding to a second portion of a full frame. This process may be repeated to generate an full image frame of more lines of pixels. In this way, the LED array may be used to generate an image of a desired resolution.

Figure 3A:
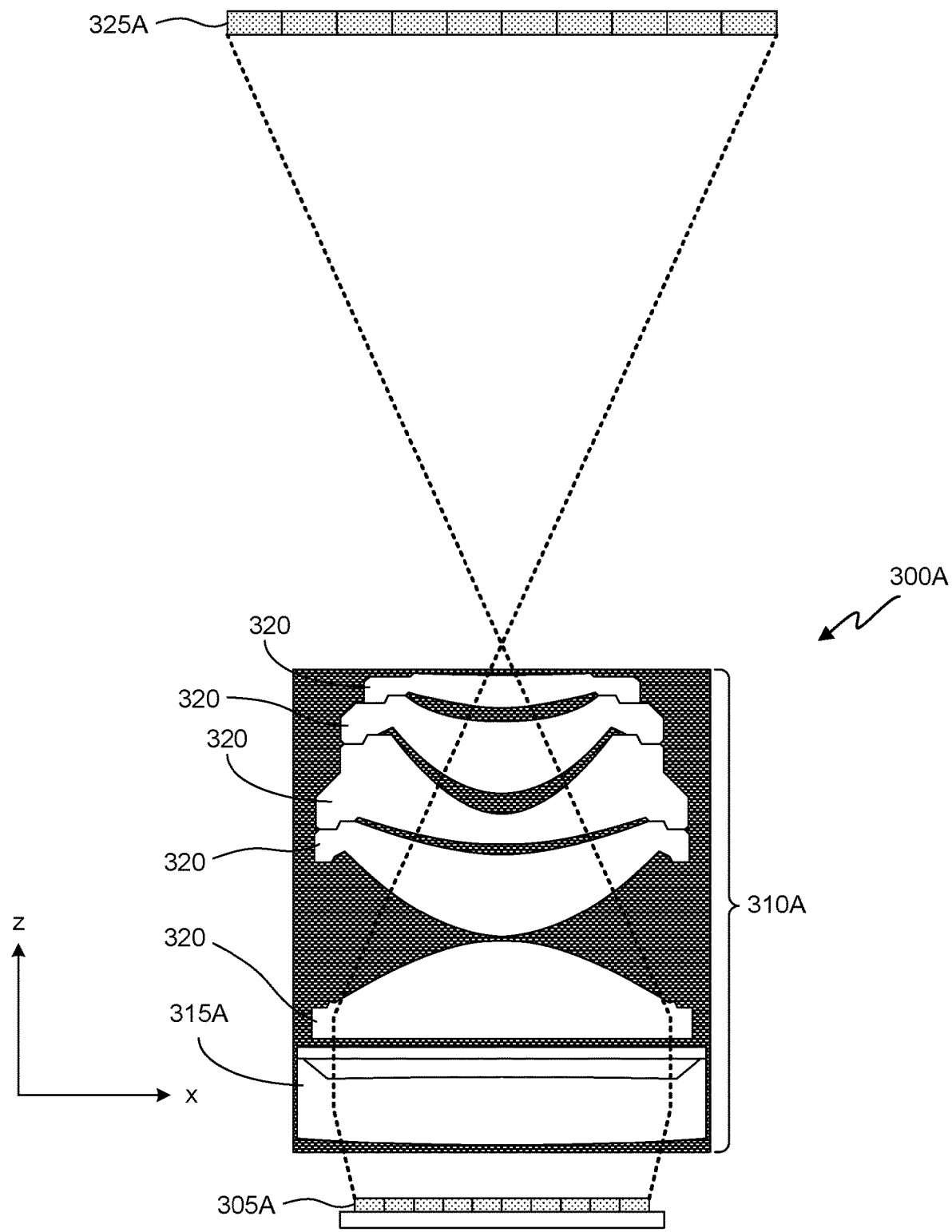
FIG. 3A provides a schematic illustration of a projector assembly in an x-z plane according to one embodiment.

FIG. 3A provides a schematic illustration of an example projector assembly 300A in an x-z plane. Projector assembly 300A includes LED array 305A and set of imaging optics 310A. Set of imaging optics 310A includes a collimator 315A and five focusing lenses 320. Collimator 315A may be used to parallelize light generated by LED array 305A, which may be divergent upon emission by the LED array 305A. Set of imaging optics 310A may be used to generate an image 325A of LED array 305A. It will be appreciated that the LED array 305A may be rotated about a rotation axis that is parallel to the x-axis in order to generate a two-dimensional image of LED array 305A.

Figure 3B:
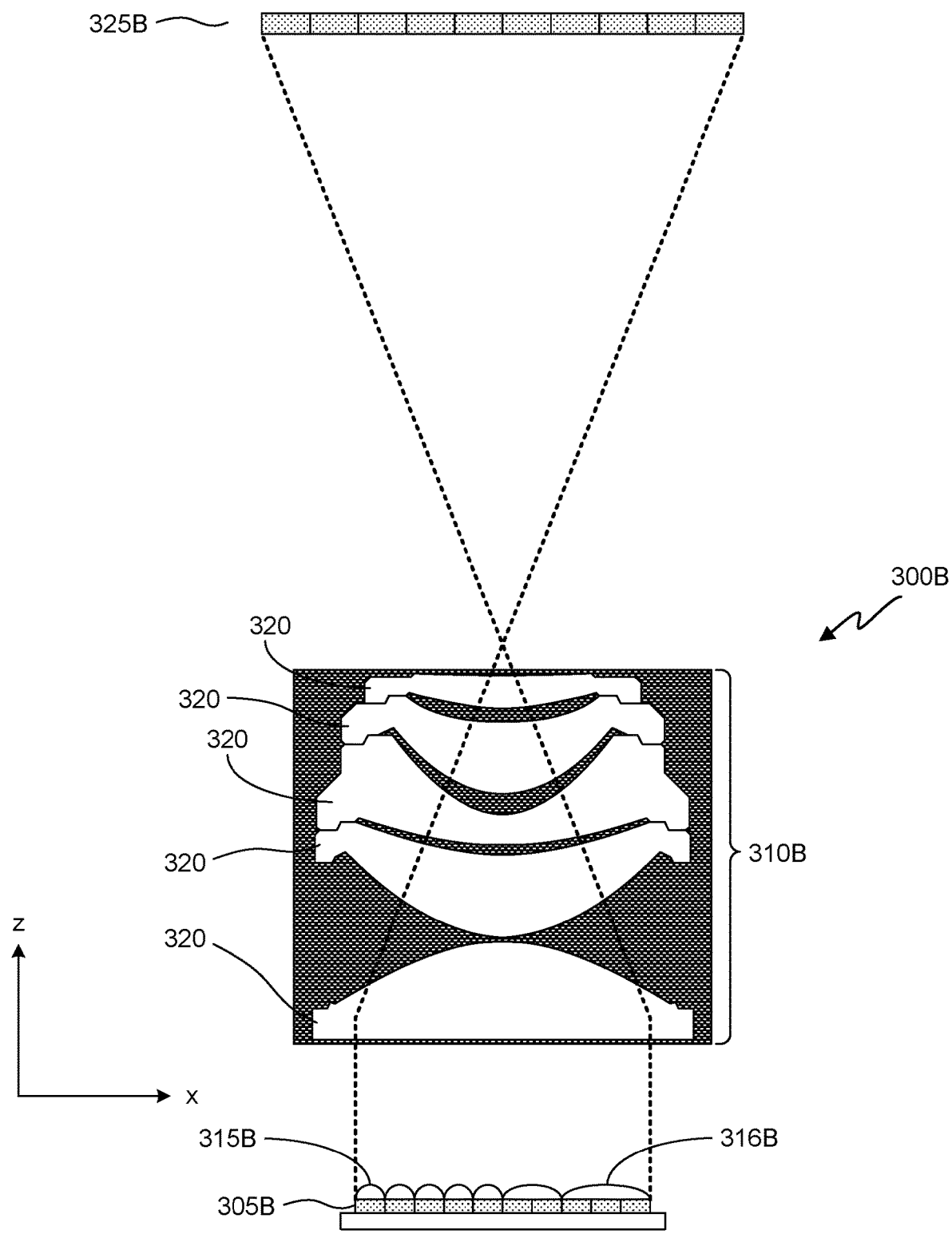
FIG. 3B provides a schematic illustration of a projector assembly in an x-z plane according to one embodiment.

FIG. 3B provides a schematic illustration of another example projector assembly 300B in an x-z plane. Projector assembly 300B includes LED array 305B and set of imaging optics 310B. Set of imaging optics 310B includes five focusing lenses 320 and does not include a collimator. Collimation elements 315B and 316B are optionally attached to and/or part of LED array 305B to individually parallelize the light generated by the LED elements of LED array 305B. Individual collimation elements 315B may optionally be used to collimate light from individual LED elements. Shared collimation elements 316B may optionally be used to collimate light from multiple LED elements, such as from two or more individual LED elements or multiple LED sub-elements. Set of imaging optics 310B and collimation elements 315B and 316B may be used to generate an image 325B of LED array 305B. It will be appreciated that the LED array 305B may be rotated about a rotation axis that is parallel to the x-axis in order to generate a two-dimensional image of LED array 305B.

Figure 3C:
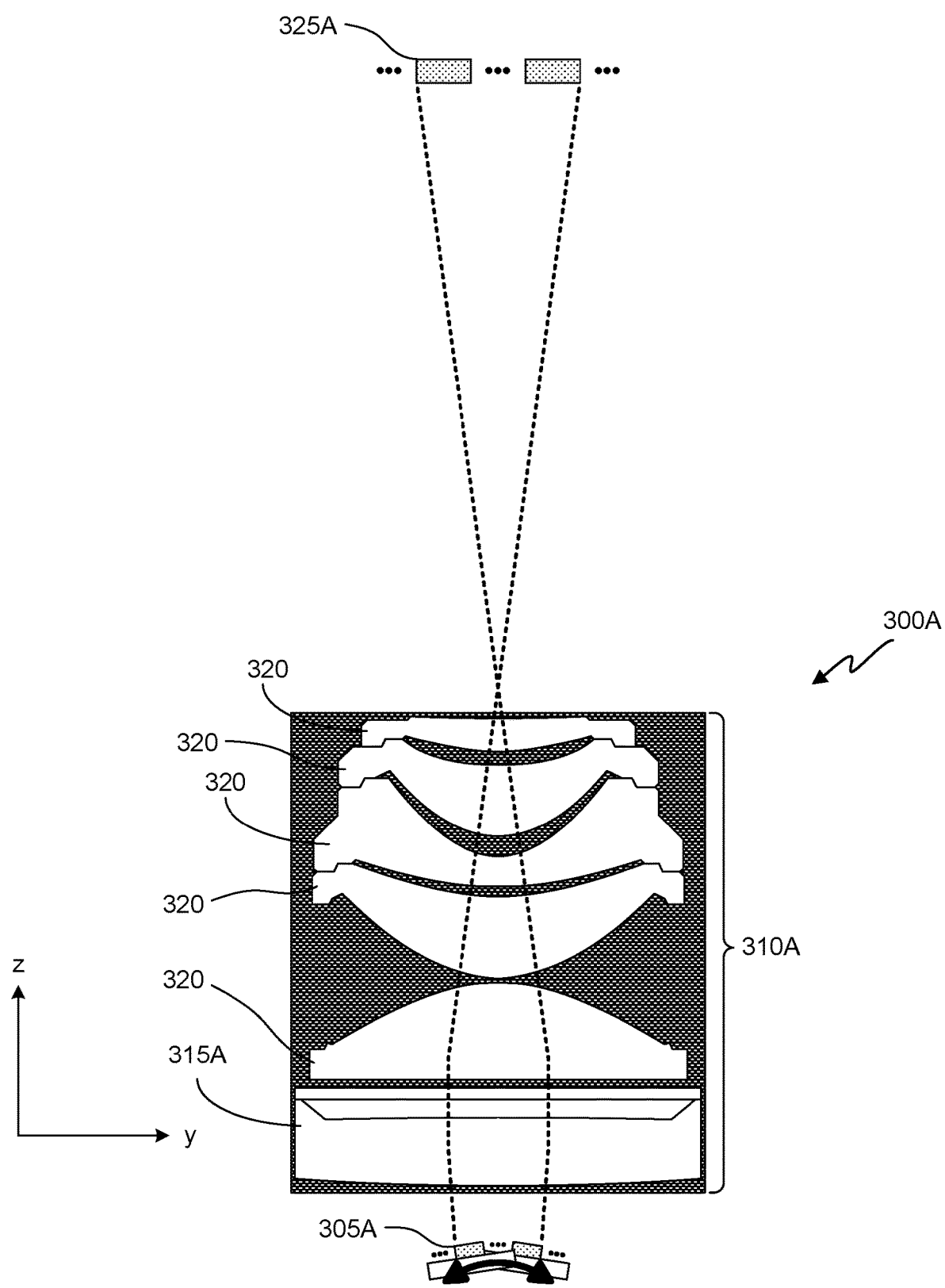
FIG. 3C provides a schematic illustration of a projector assembly in a y-z plane according to one embodiment.

FIG. 3C provides a schematic illustration of projector assembly 300A in a y-z plane. Here, the rotation of the LED array 305A about an axis parallel to the x-axis is depicted, showing two discrete positions of the LED array 305A. Image 325A accordingly shows two discrete components corresponding to the two discrete positions of LED array 305.

Figure 3D:
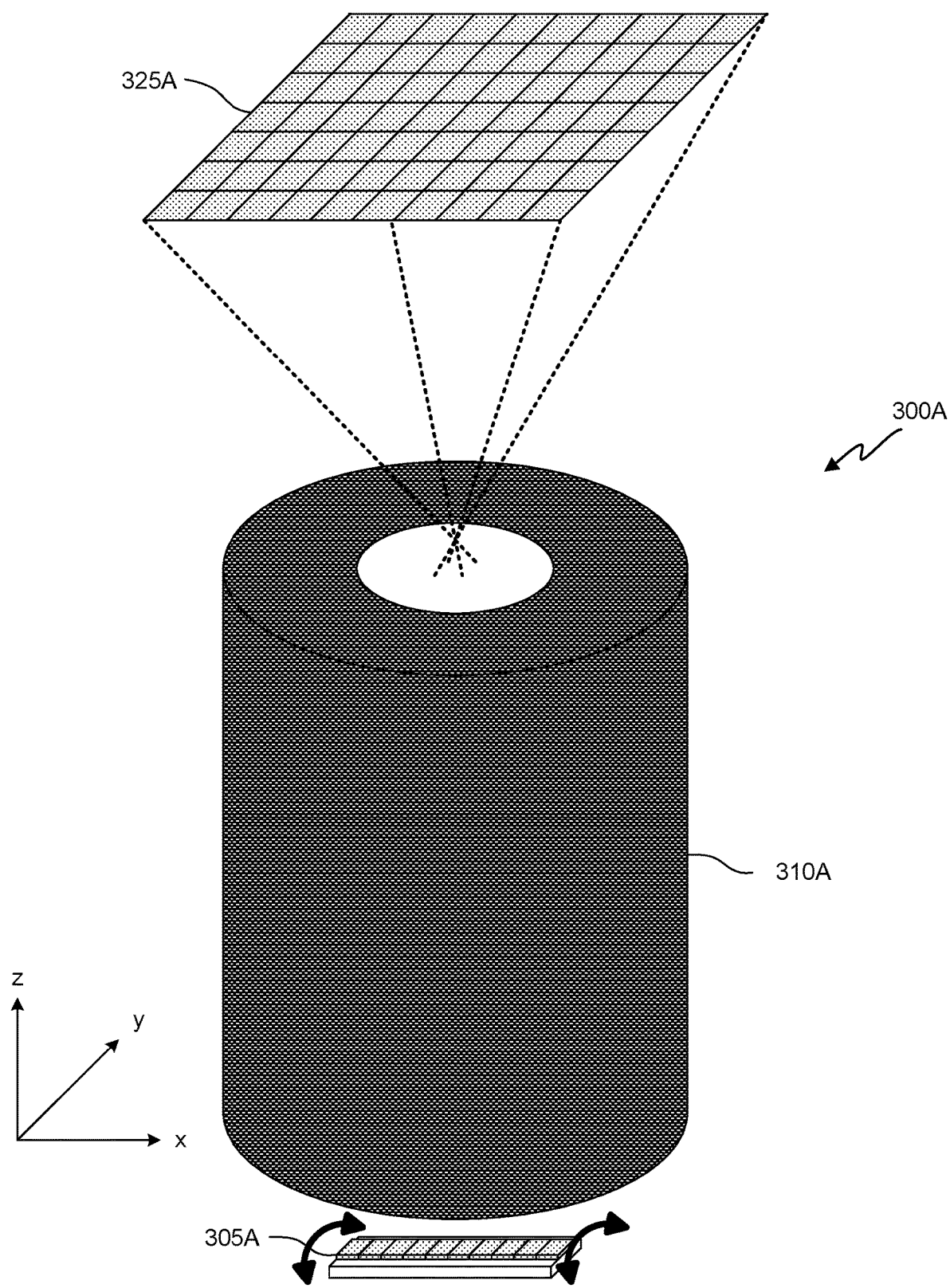
FIG. 3D provides a perspective view schematic illustration of a projector assembly according to one embodiment.

FIG. 3D provides a perspective view schematic illustration of projector assembly 300A, showing x-, y-, and z-axes. Here, the rotation direction of the LED array 305A about an axis parallel to the x-axis is depicted, but discrete positions of the LED array 305A are not shown. Image 325A shows how discrete components may together make up a two-dimensional composite image.

It will be appreciated that although the LED array 305A is shown as a one-dimensional array, LED array 305A may be a two dimensional array, such as an array that includes two or more rows and any number of LED elements in each row (e.g., 10 elements as shown in FIG. 3D). A configuration including a two dimensional array may be operated according to the same principles described herein to generate a two dimensional image, but half as many different positions for the LED array may be required for a two-row array as a one-row array for generation of an image of the same number of pixels. Alternatively, overlapping pixel sub-elements may be generated, as described above.

In some embodiments, it may be desirable to generate two or more spatially separate images using a single projection system. In one embodiment, multiple image generation may be provided by using two separate LED arrays. In another embodiment, multiple image generation may be provided by using one LED array and translating the LED array to separate positions in order to generate the multiple images. In some embodiments, generating different images may be useful for generating a first image representing a first depth plane and a second image representing a second depth plane, such as for use in generation of a three-dimensional image.

Figure 4:
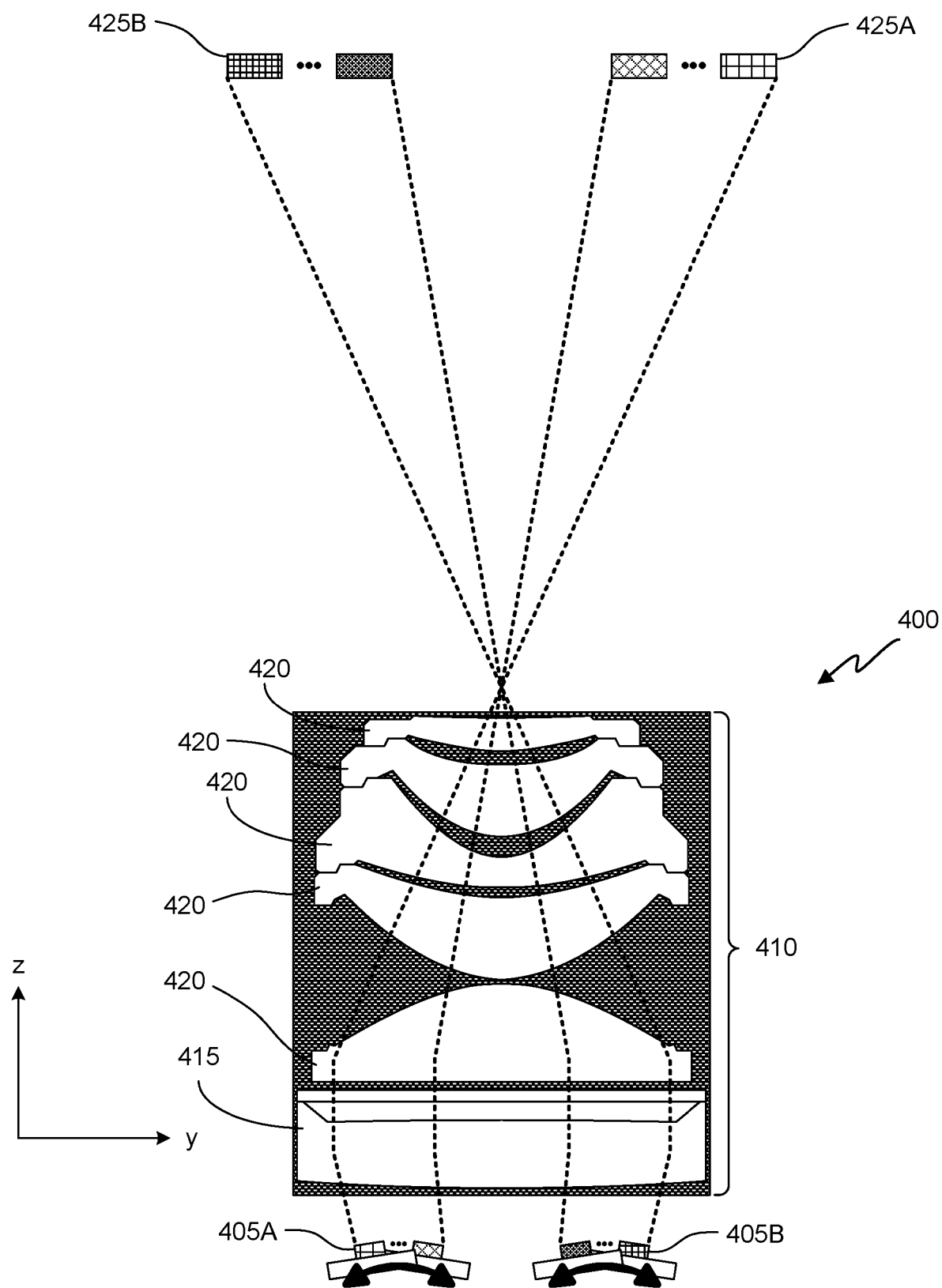
FIG. 4 provides a schematic illustration of an LED-based projector assembly including two LED arrays for generation of images according to one embodiment.

FIG. 4 provides a schematic illustration of an example projector assembly 400 in a y-z plane for generating multiple images. Projector assembly 400 includes LED array 405A and 405B and set of imaging optics 410. Set of imaging optics 410 includes a collimator 415 and five focusing lenses 420. Collimator 415 may be used to parallelize light generated by LED arrays 405A and 405B, which may be divergent upon emission by the LED arrays 405A and 405B. Set of imaging optics 410 may be used to generate an first image 425A of LED array 405A and a second image 425B of LED array 405B. Outputs from each LED element of LED array 405A and 405B may be independently controllable. Each of LED array 405A and 405B may be independently rotatable.

Figure 5A:
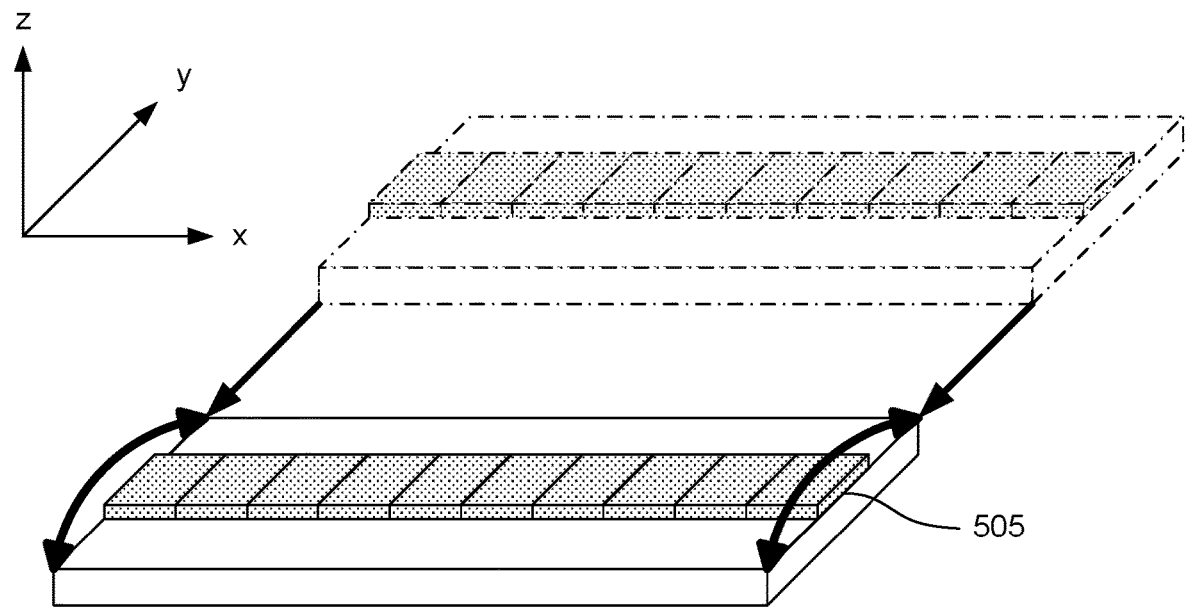
FIG. 5A and FIG. 5B illustrate rotation and translation of an LED array according to one embodiment.
Figure 5B:
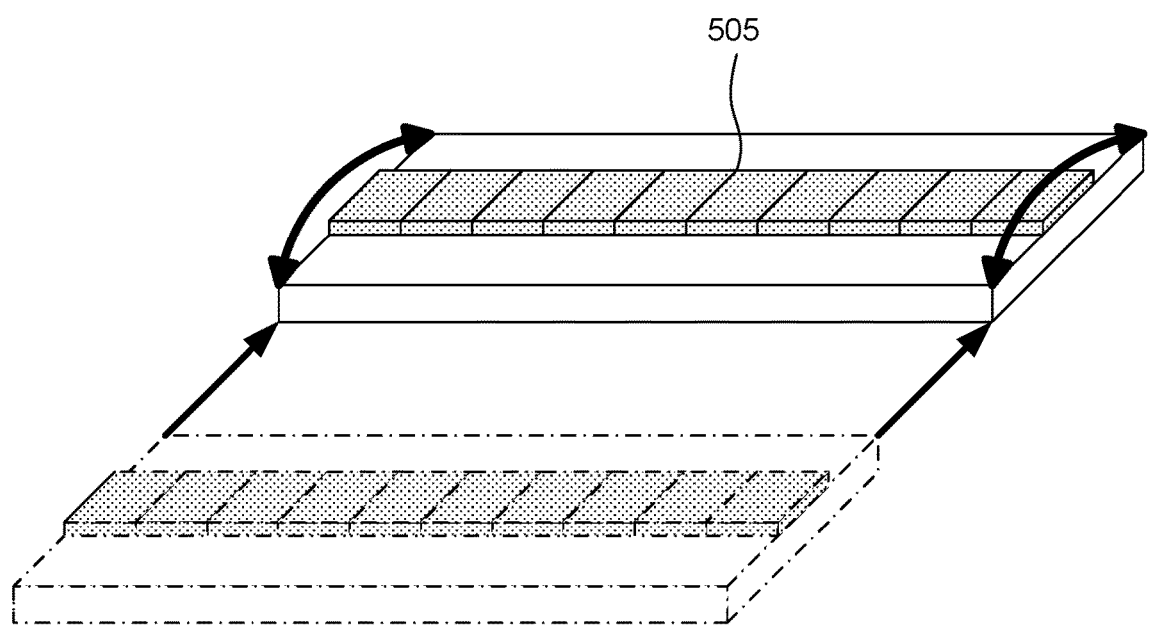

FIG. 5A and FIG. 5B provide perspective view schematic illustrations showing translation of a single LED array 505 for use in generating multiple images. In FIG. 5A, LED array 505 is translated along a negative y direction and then the LED array is rotated about an axis of rotation for generation of a first image. In FIG. 5B, LED array 505 is translated along a positive y direction and then the LED array is rotated about an axis of rotation for generation of a second image. Different translatable actuators may be useful for translating the LED array 505. For example, a linear translatable microelectromechanical actuator may be used to translate the LED array 505 between discrete positions. Alternatively or additionally, a piezoelectric actuator may be used to translate the LED array 505 between discrete positions. It will be appreciated that translation of the LED array 505 may also result in the translation of any rotatable actuator providing the depicted rotation. Thus, the LED array and rotatable actuator supporting the LED array may all be provided on a translation stage using one or more translation actuators, for example.

Figure 5C:
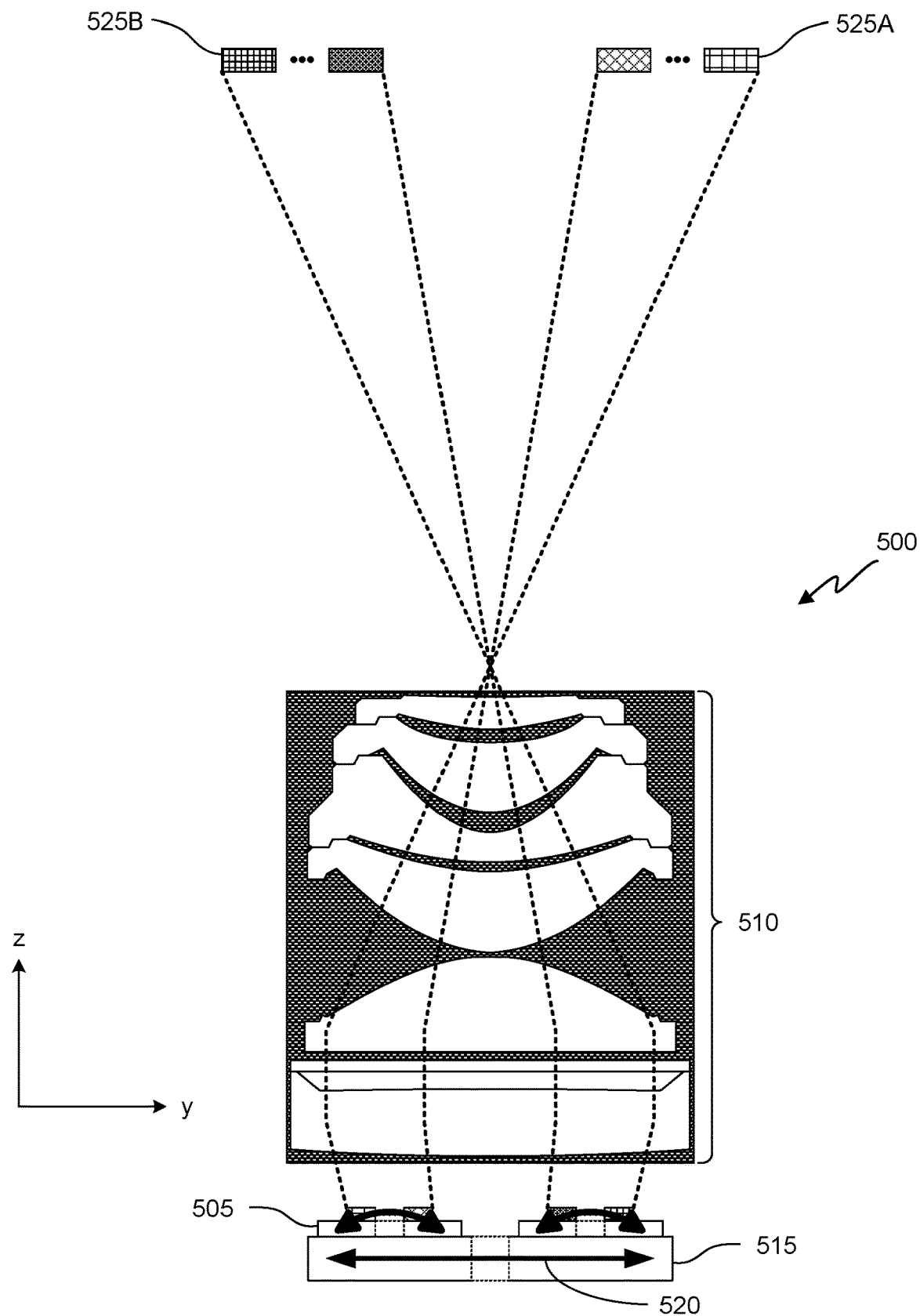
FIG. 5C provides a schematic illustration of an LED-based projection system that uses rotation and translation for generation of images according to one embodiment.

FIG. 5C provides a schematic illustration an example projector assembly 500 in a y-z plane for generating multiple images making use of LED array 505 and accompanying translation components. Similar to the other projection systems described herein, projector assembly 500 includes a set of imaging optics 510. LED array 505 is supported by a translatable actuator 515 in order to translate 520 the LED array 505 between different positions. As illustrated, LED array is used in a first position to generate a first two-dimensional image 525A and translated to a second position where it is used to generate a second two-dimensional image 525B.

Figure 6A:
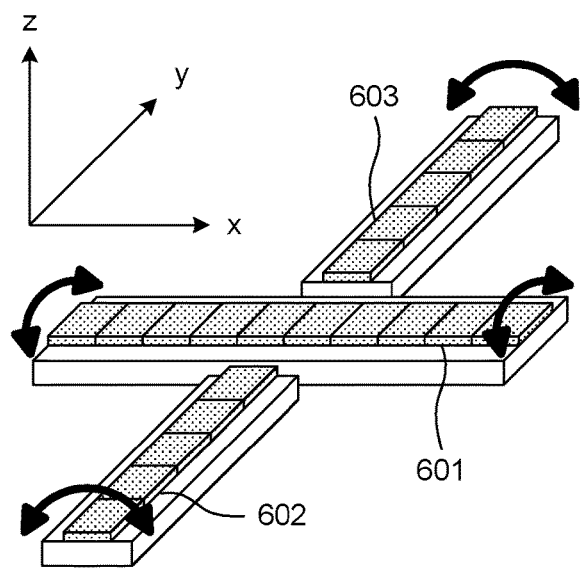
FIG. 6A provides a perspective view of multiple LED arrays according to one embodiment.
Figure 6B:
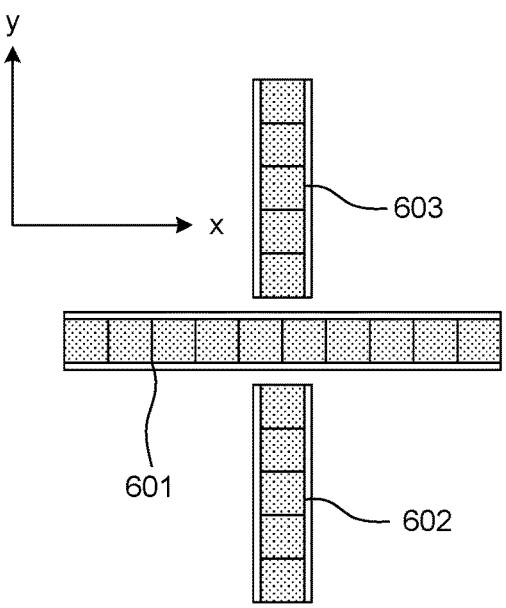
FIG. 6B provides a schematic illustration of multiple LED arrays in the x-y plane according to one embodiment.
Figure 6C:
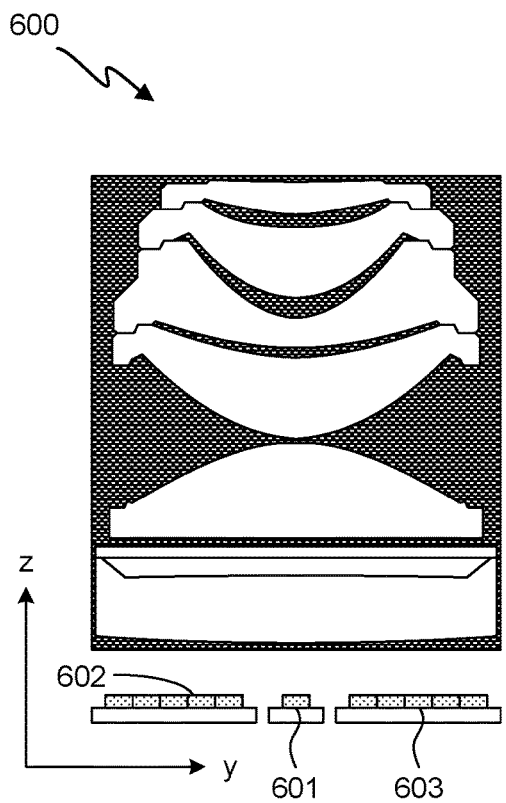
FIG. 6C provides a schematic illustration of an LED-based projector assembly including multiple LED arrays in the y-z plane according to one embodiment.
Figure 6D:
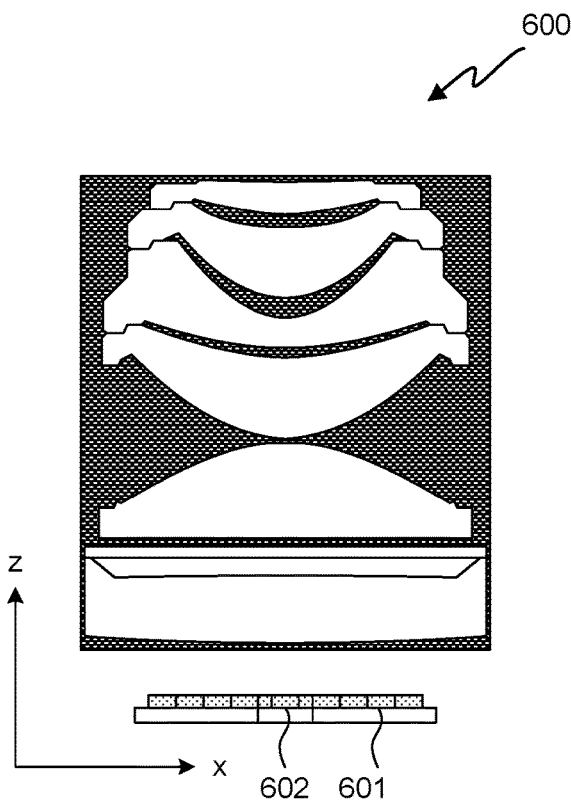
FIG. 6D provides a schematic illustration of an LED-based projector assembly including multiple LED arrays in the x-z plane according to one embodiment.

FIG. 6A-6D illustrate an alternative embodiment including multiple LED arrays 601, 602, and 603. In this embodiment, LED arrays 602 and 603 are oriented perpendicular to LED array. FIG. 6A shows a perspective view of the LED arrays 601, 602, and 603, illustrating that LED array 601 is rotated about an axis parallel to the x-axis and that LED arrays 602 and 603 are rotated about an axis parallel to the y-axis. FIG. 6B illustrates a schematic view of the LED arrays 601, 602, and 603 in the x-y plane. Views of the LED arrays 601, 602, and 603 in a projector assembly 600 are illustrated in FIG. 6C in the y-z plane and in FIG. 6D in the x-z plane.

The projector assembly 600 illustrated in FIGS. 6A-6D may beneficially take advantage of the perpendicular arrangement between LED array 601 and LED arrays 602 and 603. For example, LED array 601 may project a first 2-dimensional image where a first axis of the image corresponds to the array axis of and a second axis of the image corresponds to an axis orthogonal to the rotation axis, which may be parallel to the array axis, as illustrated in FIG. 6A. Meanwhile, LED arrays 602 and/or 603 may similarly generate a second 2-dimensional image in a similar way, though the axis of rotation of LED arrays 602 and 603 is perpendicular to that of LED array 601. In embodiments, the first two-dimensional image and the second two-dimensional image may overlap at an image plane.

Figure 7A:
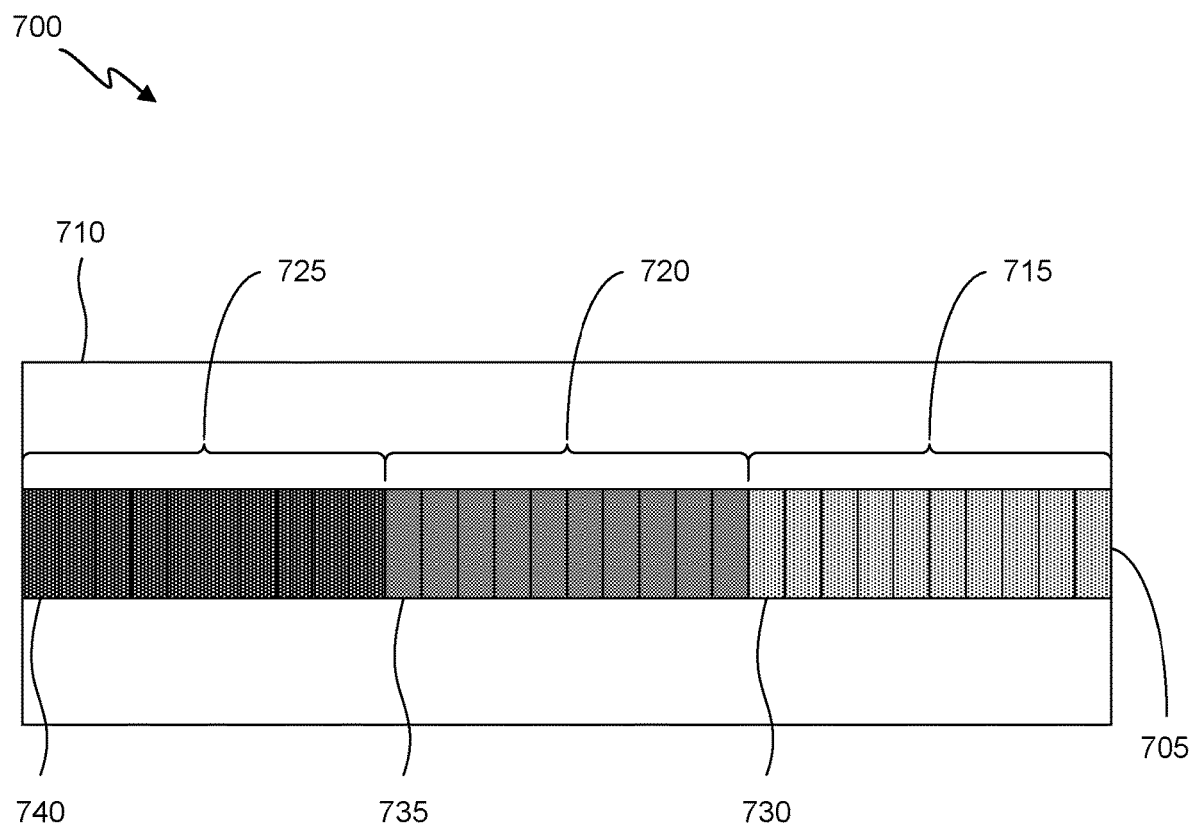
FIG. 7A illustrates an example LED array including distinct sets of LEDs of three different colors according to one embodiment.

FIG. 7A illustrates another embodiment of an LED array 705 including distinct sets of LEDs of three different colors on a support structure 710, such as a movable actuator. For example, set 715 may correspond to a set of LED elements outputting red light (e.g., including light having a wavelength of about 650 nm). Set 720 may correspond to a set of LED elements outputting green light (e.g., including light have a wavelength of about 520 nm). Set 725 may correspond to a set of LED elements outputting blue light (e.g., including light have a wavelength of about 450 nm).

Such a configuration may be useful for generating separate single-color images, which may be subsequently combined to generate a full color image. In some embodiments, the LEDs of the different LED sets 715, 720, and 725 may have corresponding LED elements in each of the other LED sets. For example, LED element 730 may correspond to an LED element generating red light for a particular pixel of an image, LED element 735 may correspond to an LED element generating green light for the particular pixel of the image, and LED element 740 may correspond to an LED element generating blue light for the particular pixel of the image. The single-color images may be combined using a variety of light direction and focusing techniques that may utilize one or more lenses, mirrors, fiber optic elements, waveguide elements, and/or diffractive elements, for example.

Figure 7B:
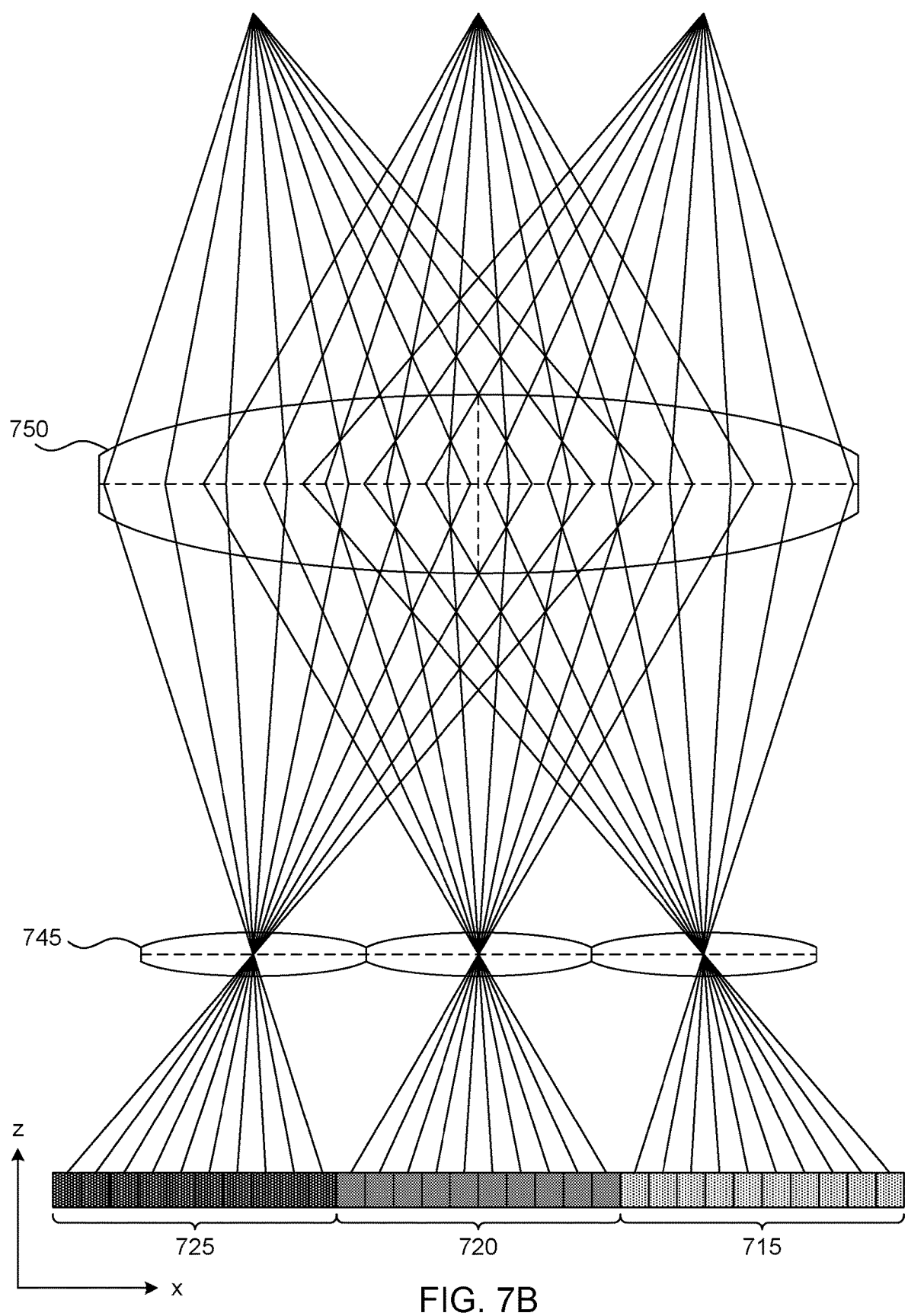
FIG. 7B illustrates components of a projector assembly for generating spatially distinct images of distinct sets of LEDs according to one embodiment.

For example, FIG. 7B illustrates one embodiment of components of a projector assembly for generating spatially distinct images of distinct sets of LEDs 715, 720, and 725. In FIG. 7B, lenslet array 745 is shown for initially focusing and spatially separating light from the different LED sets 715, 720, and 725. Optical element 750 is illustrated as a single focusing lens, but a set of imaging optics may be alternatively used in place of optical element 750, such as a set of imaging optics including one or more lenses or mirrors that serve to collimate, converge, or diverge the light in order to generate an image. After focusing, the light may be recombined using additional optical elements in order to combine the light to generate a full color image. It will be appreciated that the LED array 705 may be rotated about an axis parallel to the x-axis in FIG. 7B so that the different LED sets 715, 720, and 725 can have their outputs adjusted to generate a 2-dimensional image, as described above.

Figure 8:
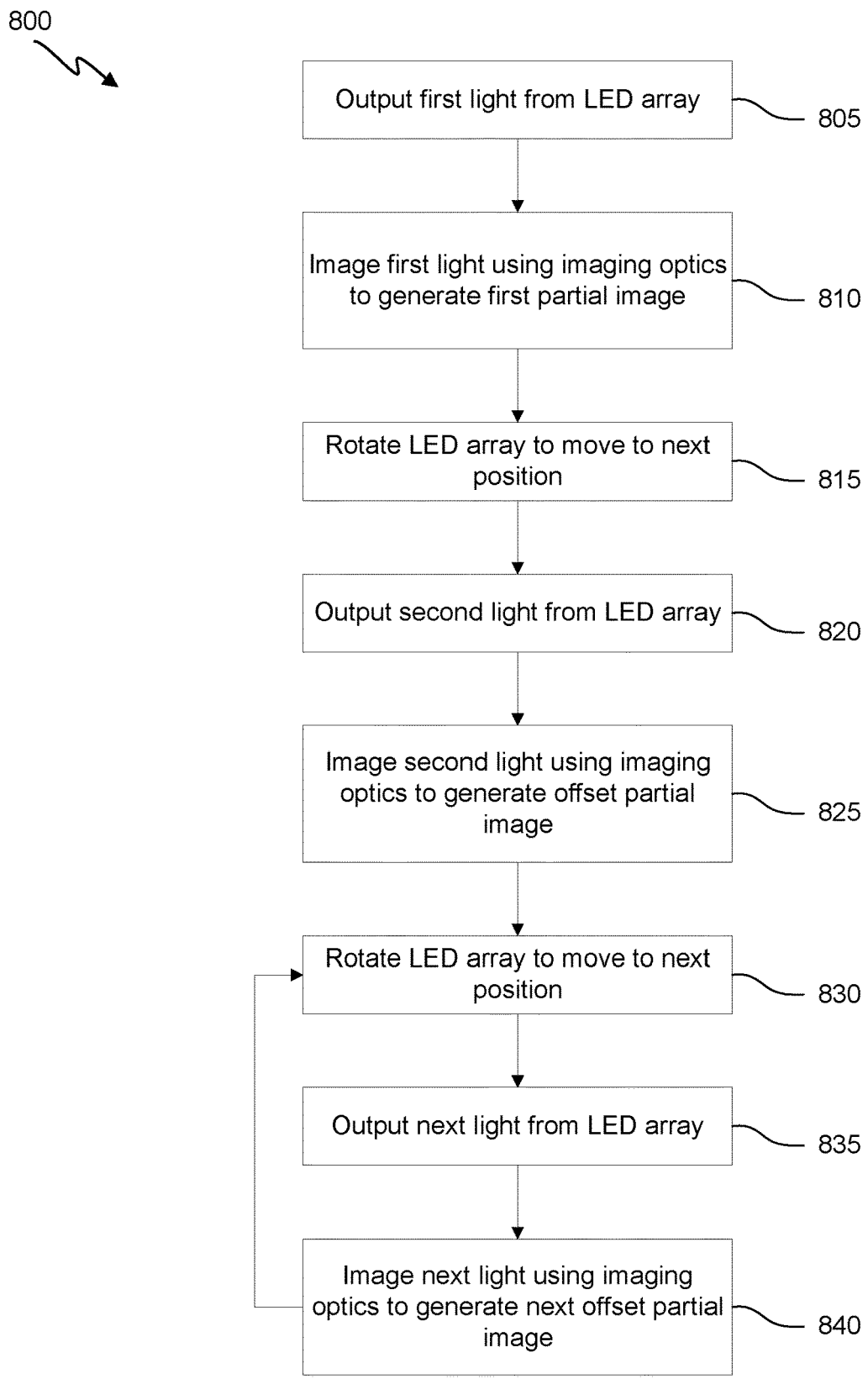
FIG. 8 provides an overview of an example image projection method according to one embodiment.

FIG. 8 provides an overview of an example embodiment of a method 800 for generating and projecting an image, such as by using a projector assembly. At block 805, first light from an LED array is generated. As described above, the output of each LED element in the LED array may be independently controllable, which may allow for generation of an output pattern corresponding to a partial image.

At block 810, the first light is imaged using a set of imaging optics in order to generate a first partial image. Imaging may include refracting or reflecting the light, for example. Imaging may make use of reflection optics, focusing optics, diverging optics, collimation optics, etc. Imaging may include projecting the light to a particular distance, such as a distance corresponding to a convergence plane.

At block 815, the LED array is rotated to move the LED array to the next position for generation of the next partial image. Rotation of the LED array may be achieved by use of a rotatable actuator, such as a microelectromechanical actuator. Although the LED array is indicated in FIG. 8 as being rotated, in some embodiments, the LED array may be translated instead of rotated, such as by using a translatable actuator, such as a piezoelectric actuator.

At block 820, second light from the LED array is generated. Again, the output of each LED element may be independently controllable and the output may be distinct from that corresponding to the first light.

At block 825, the second light is imaged using the set of imaging optics to generate a second partial image. Due to the rotation of the LED array, the second partial image may be at least partially spatially offset from the first partial image. In a specific embodiment, the first and second partial images do not overlap. In other embodiments, the first and second partial images at least partly overlap.

At block 830, the LED array is rotated to move the LED array to the next position for generation of the next partial image. At block 835 the next light from the LED array is generated for the next partial image. At block 840 the next light is imaged using the set of imaging optics to generate the next partial image, which may be at least partially offset from the first and second partial images.

Optionally, blocks 830, 835, and 840 may be repeated one or more times in order to generate a full image comprising a plurality of partial images. For example, blocks 830, 835, and 840 may be repeated a sufficient number of times to generate a full image including as many lines of pixels as are present in a full resolution image.

Blocks 830, 835, and 840 may also be repeated continuously in order to generate a sequence of full images, such as make up a video image. In such a case, at some point the LED array may be rotated back to the position corresponding to that at which the first light from the LED array is generated. In embodiments, this process may occur at about 30 Hz or about 60 Hz or a particular frequency corresponding to a refresh or frame rate of a video display output.

It will be appreciated that for embodiments including multiple LED arrays, method 800 may be independently used for each of the multiple LED arrays. In this way, each of the multiple LED arrays may independently generate a full image and or sequence of full images.

Figure 9:
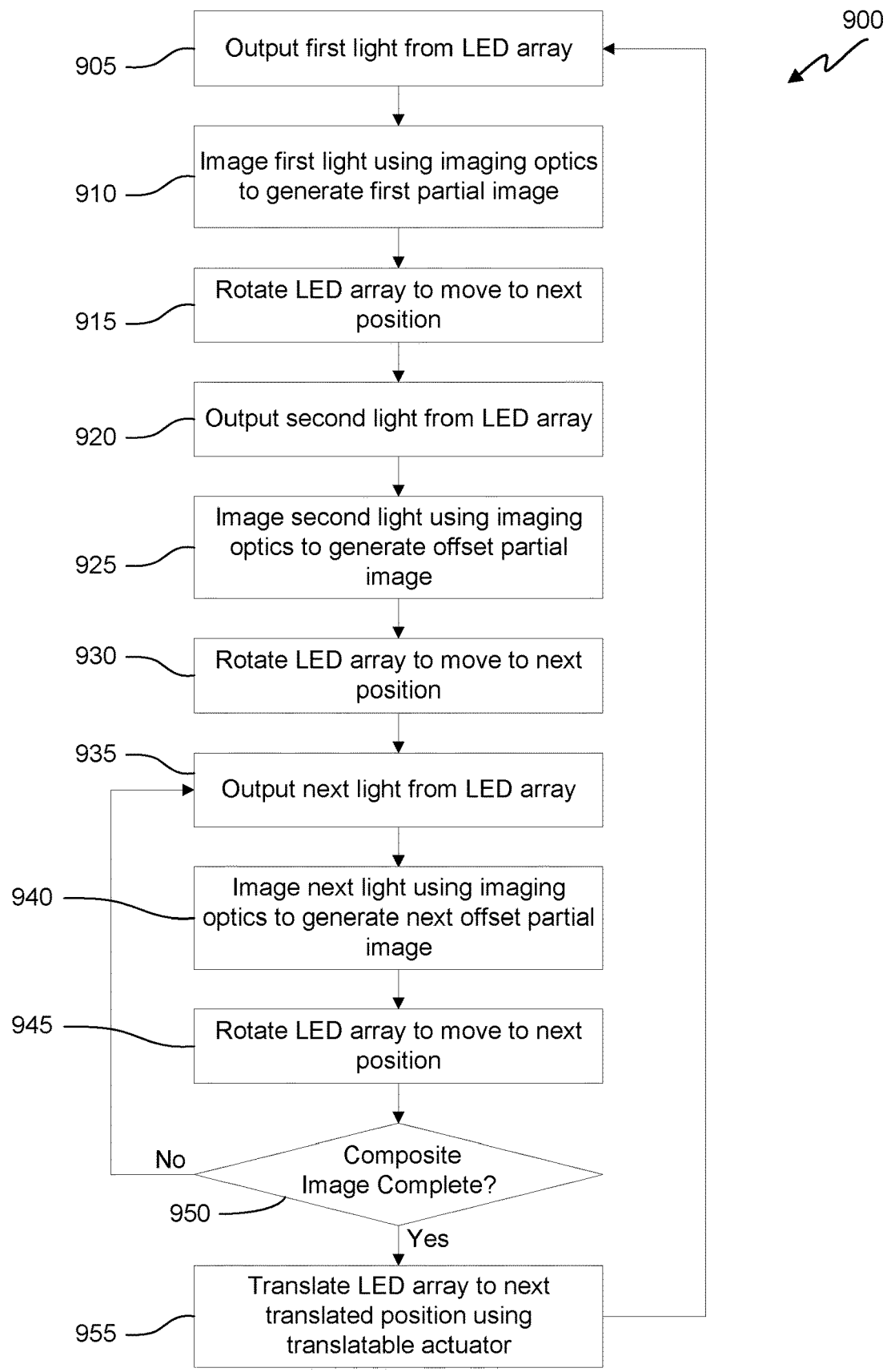
FIG. 9 provides an overview of an example image projection method according to one embodiment.

FIG. 9 provides an overview of an example embodiment of a method 900 for generating and projecting images, such as by using a projector assembly that includes an LED array on a translatable actuator. At block 905, first light from an LED array is generated. As described above, the output of each LED element in the LED array may be independently controllable, which may allow for generation of an output pattern corresponding to a partial image.

At block 910, the first light is imaged using a set of imaging optics in order to generate a first partial image. Imaging may include refracting or reflecting the light, for example. Imaging may make use of reflection optics, focusing optics, diverging optics, collimation optics, etc. Imaging may include projecting the light to a particular distance, such as a distance corresponding to a convergence plane.

At block 915, the LED array is rotated to move the LED array to the next position for generation of the next partial image. Rotation of the LED array may be achieved by use of a rotatable actuator, such as a microelectromechanical actuator. Although the LED array is indicated in FIG. 9 as being rotated, in some embodiments, the LED array may be translated instead of rotated, such as by using a translatable actuator, such as a piezoelectric actuator for generating the next partial image.

At block 920, second light from the LED array is generated. Again, the output of each LED element may be independently controllable and the output may be distinct from that corresponding to the first light.

At block 925, the second light is imaged using the set of imaging optics to generate a second partial image. Due to the rotation of the LED array, the second partial image may be at least partially spatially offset from the first partial image. In a specific embodiment, the first and second partial images do not overlap. In other embodiments, the first and second partial images at least partly overlap. At block 930, the LED array is rotated to move the LED array to the next position for generation of the next partial image.

At block 935 the next light from the LED array is generated for the next partial image. At block 940 the next light is imaged using the set of imaging optics to generate the next partial image, which may be at least partially offset from the first and second partial images. At block 945, the LED array is rotated to move the LED array to the next position for generation of the next partial image.

At block 950, the method may branch back to block 935 in order to repeat blocks 935, 940, and 945 if the composite image is incomplete. Block 935, 940, and 945 may be repeated one or more times in order to generate the composite image.

If the composite image is complete, block 950 may instead branch to block 955. At block 955, the LED array is translated to the next position using a translatable actuator, such as a piezoelectric actuator or a microelectromechanical actuator. With the LED array positioned in a translated position, the process may be repeated in order to generate a second composite image, which may be at least partially spatially offset from the previously generated composite image.

It will be appreciated that method 900 may be repeated continuously in order to generate a sequence of composite images, such as make up video images. In such a case, at some point the LED array may be translated back to the position corresponding to that at which the first composite image is generated. In embodiments, this process may occur at about 30 Hz or about 60 Hz or a particular frequency corresponding to a refresh or frame rate of a video display output.

Figure 10:
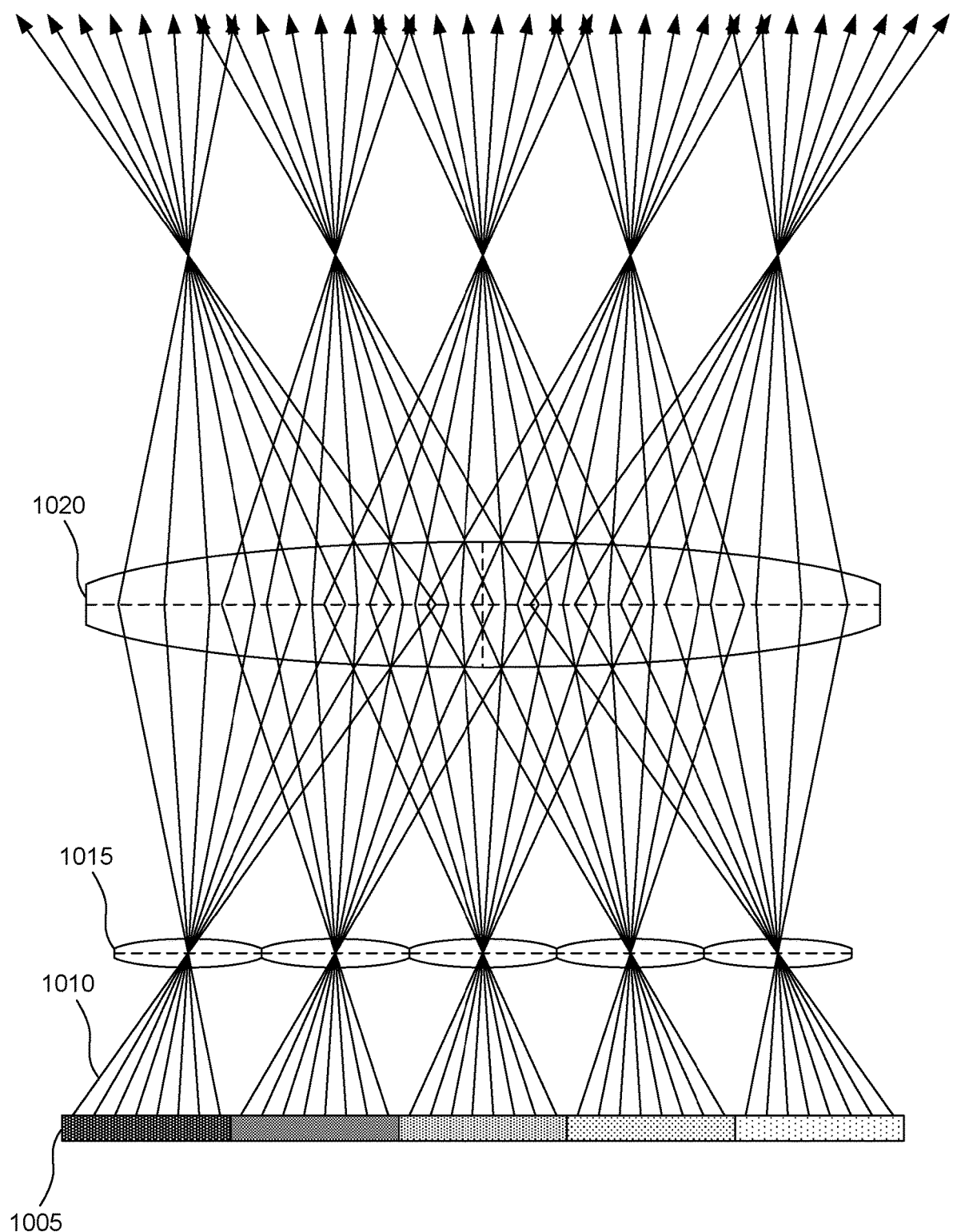
FIG. 10 provides an overview of imaging light from an LED array while retaining directional information according to one embodiment.

FIG. 10 provides an overview of imaging light from an LED array while retaining directional information according to one embodiment. LED array 1005 generates light 1010 that is spatially separated by one or more lens elements 1015 and then refocused using a set of imaging optics 1020, depicted here as a single focusing lens. The lens elements 1015 and set of imaging optics 1020 optionally allow the output light to retain the directional information of the light generated by the LED array 1005.

Alternatively, set of imaging optics 1020 may include one or more electro-optic elements, such as elements for modulating, controlling, or retaining a phase of the light generated by the LED array. It will be appreciated that by retaining and/or controlling two or more of direction, amplitude, and phase of the light generated by the LED array, a multidimensional light field may be generated as the output of the optical configuration, such as where the direction that the light is observed from may impact the intensity of the light.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A projector assembly, comprising:
   a light emitting diode (LED) array, wherein the LED array has an array axis, wherein the LED array includes a plurality of LEDs arranged along the array axis, and wherein the plurality of LEDs are individually addressable;
   a set of imaging optics positioned in optical communication with the LED array for forming an image of the LED array at a distance; and
   a translatable actuator mechanically connected to the set of imaging optics for generating relative motion between the LED array and the set of imaging optics along a translation axis perpendicular to the array axis, wherein the image includes a first axis corresponding to the array axis and a second axis corresponding to the translation axis.

2. The projector assembly of claim 1, wherein the translatable actuator is configured to translate the set of imaging optics to a plurality of positions along the translation axis.

3. The projector assembly of claim 1, wherein the translatable actuator is configured to translate the set of imaging optics a distance corresponding to a lateral dimension of an LED in the array.

4. The projector assembly of claim 1, wherein the LED array comprises a two-dimensional LED array, wherein the array axis is a first array axis, wherein the LED array further has a second array axis parallel to the translation axis, and wherein at least a portion of the plurality of LEDs are arranged along the second array axis.

5. The projector assembly of claim 1, wherein the translation axis is a first translation axis, and wherein the translatable actuator further has a second translation axis parallel to the array axis.

6. The projector assembly of claim 5, wherein the translatable actuator is configured to translate the set of imaging optics to a first plurality of positions along the first translation axis and a second plurality of positions along the second translation axis.

7. The projector assembly of claim 5, wherein the translatable actuator comprises a first translatable actuator for translations along the first translation axis and a second translatable actuator for translations along the second translation axis.

8. The projector assembly of claim 1, wherein one or more LEDs in the LED array include a plurality of sub-elements, wherein the plurality of sub-elements are arranged parallel and/or perpendicular to the array axis.

9. The projector assembly of claim 1, wherein the plurality of LEDs have independently controllable output amplitudes.

10. A method of generating and projecting an image, the method comprising:
   creating a first partial image using a projector assembly, wherein the projector assembly includes:
      a light emitting diode (LED) array, wherein the LED array has an array axis, wherein the LED array includes a plurality of LEDs arranged along the array axis, and wherein the plurality of LEDs are individually addressable;
      a set of imaging optics positioned in optical communication with the LED array for forming an image of the LED array at a distance; and
      a translatable actuator mechanically connected to the set of imaging optics for generating relative motion between the LED array and the set of imaging optics along a translation axis perpendicular to the array axis,
   wherein creating the first partial image includes generating a first light output using the LED array at a first position relative to the set of imaging optics, wherein the first light output is imaged by the set of imaging optics to form the first partial image;
   translating the set of imaging optics to a second position along the translation axis using the translatable actuator; and
   creating a second partial image using the projector assembly, wherein creating the second partial image includes generating a second light output using the LED array with the set of imaging optics positioned at the second position, wherein the second light output is imaged by the set of imaging optics to form the second partial image, and wherein the first partial image and the second partial image together form a two-dimensional composite image.

11. The method of claim 10, wherein translating the set of imaging optics comprises to translating the LED array or the set of imaging optics a distance corresponding to a lateral dimension of an LED in the array.

12. The method of claim 10, further comprising
   translating the set of imaging optics to one or more additional positions along the translation axis using the translatable actuator; and
   creating one or more additional partial images using the projector assembly, wherein creating the one or more additional partial images includes generating one or more additional light outputs using the LED array with the set of imaging optics positioned at the one or more additional positions, wherein the one or more additional light outputs are imaged by the set of imaging optics to form the one or more additional partial images, and wherein the first partial image, the second partial image, and the one or more additional partial images together form the two-dimensional composite image.

13. The method of claim 10, wherein the translatable actuator is configured to translate the set of imaging optics to a plurality of discrete positions along the translation axis or a plurality of discrete positions perpendicular to the translation axis.

14. The method of claim 10, wherein the LED array comprises a two-dimensional LED array, wherein the array axis is a first array axis, wherein the LED array further has a second array axis parallel to the translation axis, and wherein at least a portion of the plurality of LEDs are arranged along the second array axis.

15. The method of claim 10, wherein the translation axis is a first translation axis, and wherein the translatable actuator further has a second translation axis parallel to the array axis.

16. The method of claim 15, further comprising
   translating the set of imaging optics to a third position along the second translation axis using the translatable actuator; and
   creating a third partial image using the projector assembly, wherein creating the third partial image includes generating a third light output using the LED array with the set of imaging optics positioned at the third position, wherein the third light output is imaged by the set of imaging optics to form the third partial image, and wherein the first partial image, the second partial image, and the third partial image together form the two-dimensional composite image.

17. The method of claim 15, further comprising
   translating the set of imaging optics to one or more additional positions along the first translation axis or the second translation axis using the translatable actuator; and
   creating one or more additional partial images using the projector assembly, wherein creating the one or more additional partial images includes generating one or more additional light outputs using the LED array with the set of imaging optics positioned at the one or more additional positions, wherein the one or more additional light outputs are imaged by the set of imaging optics to form the one or more additional partial images, and wherein the first partial image, the second partial image, and the one or more additional partial images together form the two-dimensional composite image.

18. The method of claim 15, wherein the translatable actuator comprises a first translatable actuator for translations along the first translation axis and a second translatable actuator for translations along the second translation axis.

19. The method of claim 10, wherein one or more LEDs in the LED array include a plurality of sub-elements, wherein the plurality of sub-elements are arranged parallel and/or perpendicular to the array axis.

20. The method of claim 10, wherein the plurality of LEDs have independently controllable output amplitudes and wherein creating a partial image comprises controlling the output amplitudes for the plurality of LEDs according to a full image frame.

* * * * *